United States Patent [19]

Shimode et al.

[11] Patent Number: 5,427,102
[45] Date of Patent: Jun. 27, 1995

[54] ACTIVE NOISE CANCELLATION APPARATUS IN MRI APPARATUS

[75] Inventors: Shin'ichi Shimode; Hiroshi Inouye, both of Ibaraki; Norihide Saho, Tsuchiura; Shinya Okabe, Shimizu; Masayuki Otsuka, Katsuta; Yukiji Iwase, Ushiku; Etsuji Yamamoto, Akishima; Hidemi Shiono, Akigawa; Kenji Takiguchi, Kodaira, all of Japan

[73] Assignee: Hitachi, Ltd., Tokyo, Japan

[21] Appl. No.: 331,156

[22] Filed: Oct. 28, 1994

Related U.S. Application Data

[63] Continuation of Ser. No. 901,219, Jun. 19, 1992, abandoned.

[30] Foreign Application Priority Data

Jun. 21, 1991 [JP] Japan .................. 3-150477

[51] Int. Cl.⁶ .................. A61B 5/055; H04B 15/00
[52] U.S. Cl. .................. 128/653.2; 128/653.5; 381/71; 381/94; 324/318
[58] Field of Search .................. 128/653.2, 653.5; 324/300, 309, 318, 322; 381/71, 94

[56] References Cited

U.S. PATENT DOCUMENTS

| | | |
|---|---|---|
| 4,654,871 | 3/1987 | Chaplin et al. .................. 381/94 |
| 4,696,030 | 9/1987 | Egozi .................. 381/94 |
| 4,701,952 | 10/1987 | Taylor .................. 381/67 |
| 4,878,499 | 11/1989 | Suzuki et al. .................. 128/653.2 |
| 4,903,703 | 2/1990 | Igarashi et al. .................. 128/653.2 |
| 4,981,137 | 1/1991 | Kondo et al. .................. 128/653.2 |
| 5,033,082 | 7/1991 | Eriksson et al. .................. 381/94 |
| 5,076,275 | 12/1991 | Bechor et al. .................. 128/653.2 |
| 5,084,676 | 1/1992 | Saho et al. .................. 324/322 |
| 5,133,017 | 7/1992 | Shimode et al. .................. 381/71 |

FOREIGN PATENT DOCUMENTS

| | | |
|---|---|---|
| 270195 | 3/1990 | Japan . |
| 8802912 | 4/1988 | WIPO . |
| 9002513 | 3/1990 | WIPO . |

*Primary Examiner*—Krista M. Pfaffle
*Attorney, Agent, or Firm*—Antonelli, Terry, Stout & Kraus

[57] ABSTRACT

An active noise cancellation apparatus of an MRI apparatus, including a detector for detecting vibration of a bobbin or a driving signal of a magnetism generator as a noise source signal, error signal detectors for detecting actual noise near the ears of a patient, a circuit for generating a noise cancellation signal having an opposite phase to a phase of a noise signal generated by an MRI apparatus and having an amplitude proportional to the output of the error signal detectors, from the detected noise source signal and the output of the error signal detectors, and a sound generator for generating a sound wave by the noise cancellation signal.

25 Claims, 16 Drawing Sheets

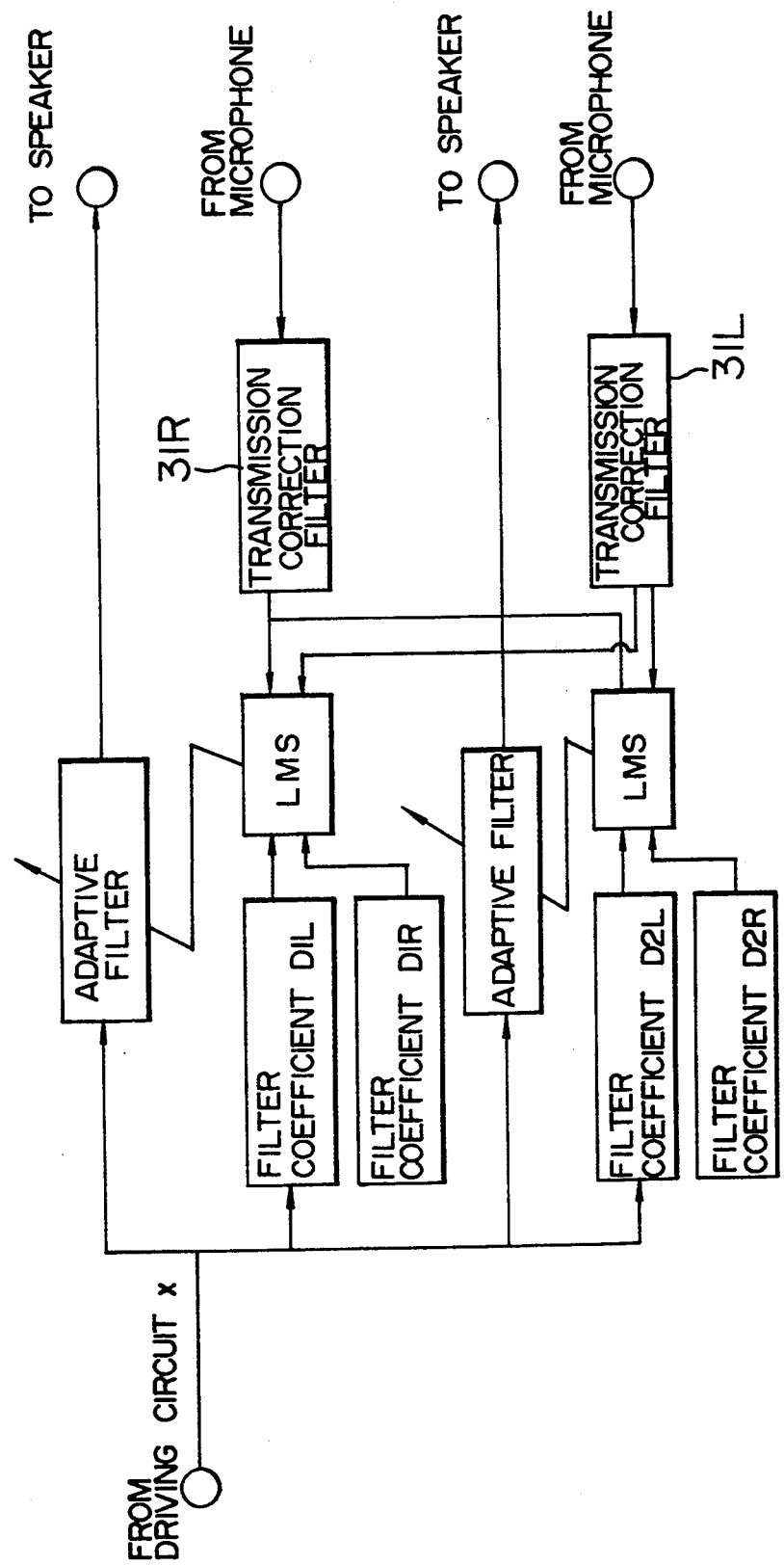

ACTIVE NOISE CANCELLATION APPARATUS IN MRI APPARATUS

This application is a continuation application of Ser. No. 07/901,219, filed Jun. 19, 1992, now abandoned.

BACKGROUND OF THE INVENTION

This invention relates to an active noise cancellation apparatus in an MRI apparatus. More in particular, it relates to an active noise cancellation apparatus for actively cancelling noise near the ears of a patient.

When a pulsating current is caused to flow through a gradient magnetic field coil fixed directly onto a bobbin in a conventional MRI apparatus, the bobbin is vibrated by an electromagnetic force and a big noise occurs from the bobbin as a whole and imparts an offensive feel to a patient. Even when a vibration-proofing rubber is sandwiched between the gradient magnetic field coil and the bobbin to proof the noise, the gradient magnetic field coil undergoes deformation to the extent corresponding to contraction of the vibration-proofing rubber between the coil and the bobbin due to the load, because of the pulsating load generated by the electromagnetic force. As a result, a change occurs in the magnetic field distribution inside a bore, which is precisely generated by the gradient magnetic field coil, and distortion of an image different from an actual image occurs in the resulting image. In this case, the softer the vibration-proofing rubber, the higher becomes the vibration-proofing effect but the greater becomes the strain of the coil. Consequently, distortion of the image becomes greater, as well.

The application of active noise cancellation technique has been investigated to cope with the problems described above, and the following references are known as the related art to the present invention.

(1) International Publication No. WO 90/02513

This reference introduces the technique which collects sound through microphones disposed close to the ears of a patient inside an MRI apparatus, generates sound from speakers and executes a control so that the sound collection quantity from the microphones becomes small.

Although this method provides the noise cancellation effect when the same noise waveforms are repeated, it becomes ineffective against random noises.

Since the noise itself inside the bobbin is detected as a noise source signal by the microphones, the sound waves generated from the speakers are picked up by the microphones and the microphone output signals are in turn fed back to the sound waves generated by the speakers. Accordingly, howling develops and active noise cancellation control cannot be carried out stably.

(2) PCT Japan Laid-Open No. Hei 1-501344 (International Laid-Open No. WO 88/02912)

This reference discloses a technique which actively cancels a sound generated by a machine, etc. More definitely, this method detects a rotation signal of a rotary shaft as data of a vibration source of a machine, and decreases signal energy of a sound sensor placed at a position at which a noise is desired to be cancelled. However, this technique involves the following problems. The noise to be cancelled comprises mainly periodic components having a number-of-revolution component as a fundamental component, and the noise to be lowered is limited to selected harmonics. Accordingly, when the noise contains random components, it cannot be cancelled because an original reference signal does not contain the random components.

When the number-of-revolution is extremely high, even if a sound is generated from a noise cancellation sound source in order to reduce a sensor output at the position where noise cancellation is to be made by the use of the reference signal, the sound generated from the sound source causes a time delay due to a calculation time, etc., in an active noise cancellation apparatus, and comes to posses difference properties from the noise arriving from the noise source. Accordingly, there are the cases where noise cancellation cannot be made.

(3) JP-A-2-70195

This reference discloses the technique which disposes a microphone on a noise generation source side and another microphone on the downstream side in a noise propagation direction, generates a noise cancellation signal from the signals from these microphones, and cancels the noise by generating a sound from speakers disposed at intermediate portions of these two microphones in order to cancel the noise generated inside a duct of an air conditioning equipment, and so forth.

However, this technique cannot be applied to the case where the noises propagate from all directions, although it can be applied to the case where the noises propagate from only one direction.

SUMMARY OF THE INVENTION

It is an object of the present invention to provide an active noise canceler (ANC) capable of efficiently cancelling a noise having random properties without lowering diagnostic performance of an MRI apparatus in the MRI apparatus which generates big noises inside its bobbin during the operation.

To accomplish the object above described, the active noise canceler according to the present invention comprises error signal detectors disposed close to the ears of a patient lying down on a table inside a bobbin of an MRI apparatus, and detecting deviation between a noise signal occurring during the operation of a magnetism generator and a noise cancellation signal for cancelling the noise; a vibration detector fitted to the inner surface of the bobbin and detecting the vibration of the bobbin during the operation of the magnetism generator; a phase/amplitude control circuit for generating a noise cancellation signal in such a fashion that the phase of a vibration signal from the vibration detector is inversed and the amplitude of the vibration signal is proportional to the magnitude of the noise signal from the error signal detector; and a sound generator for generating a sound by the noise cancellation signal.

According to another embodiment of the present invention, a signal from a driving signal detector for detecting a driving signal that drives the magnetism generator is inputted to the phase/amplitude control circuit in place of the signal from the vibration detector for detecting the vibration of the bobbin.

According to still another embodiment of the present invention, the error signal detector is disposed outside the bobbin, and a final noise cancellation signal is generated by multiplying a basic noise cancellation signal determined from a noise source signal by transmission characteristics of a sound wave transmission path comprising a space from the ears to the error signal detector.

According to another embodiment of the present invention, tubes made of a non-magnetic and non-metallic material are disposed between the ears of the patient and the error signal detector, and the phase/amplitude control circuit generates the final noise cancellation signal by multiplying the basic noise cancellation signal by the transmission characteristics of the sound wave transmission :path comprising the tubes.

According to still another embodiment of the present invention, an addition function of a music signal and a control function of a sound volume and sound quality of the music signal are added to the sound generator, or a function of adding data to be given to the patient as an audio signal is added to the sound generator.

According to still another embodiment of the present invention, a driving signal, that should originally be inputted directly to a driving circuit for generating a magnetic field, is inputted to the driving circuit through a delay circuit, the same driving signal is inputted also to an active noise canceler so as to generate a noise cancellation signal, and the noise cancellation signal is outputted in synchronism with the generation of the noise by the driving signal.

In this embodiment, the input of a reference signal to the active noise canceler (ANC) is made earlier than the signal input to the driving circuit and consequently, the sound from an additional sound source for the noise cancellation reaches more quickly the error signal detector than the noise generated from the MRI apparatus. The ANC is equipped with a controller which generates a sound having an opposite phase to the phase of the noise from the additional sound source for the noise cancellation and minimizes noise energy as the output of the error signal detector for a sound field comprising the noise from the MRI apparatus and additional sound source.

The ANC of this embodiment includes a waveform modification circuit which improves frequency characteristics by processing the driving signal and lets a reference signal contain emphatically a frequency component having a high noise level. The ANC uses transmission characteristics of this waveform modification circuit as transmission characteristics between the driving signal and the noise cancellation signal generated in accordance with this driving signal, so as to obtain a noise cancellation waveform extremely similar to the noise waveform which is to be cancelled.

The present invention provides the following advantages.

(a) Since the driving signal is not detected from the microphones close to the ears of the patient, the noise can be cancelled without causing howling.

(b) A hard rubber can be used for the vibration-proofing rubber to be sandwiched between the bobbin and the coil. Therefore, distortion of the coil becomes less, disturbance: of the magnetic field can be reduced and image quality can be improved.

(c) The signal as the basis of the noise is delayed and is then sent to the noise generation portion, and is also inputted to the ANC as a signal to be sent to the additional sound source for the noise cancellation. Since the ANC can generate a signal having an opposite phase to that of the noise arriving at the point of inspection but the same amplitude and occurring at the point of inspection, the output of the error signal detector disposed at the point of inspection can be made nearly zero is minimized.

(d) Since the occurring noise can be anticipated, noise cancellation processing need not be carried out for each frequency component even though the frequency components of the noise are irregular, and the noise at the point of inspection can be made nearly zero for each frequency component.

(e) The value of an adaptive filter coefficient when an active noise cancellation signal is determined can be increased. As a result, a noise cancellation speed at the time of the active noise cancellation can be increased and the noise cancellation effect can be improved.

(f) If an addition function of a music signal and a volume/tone control circuit of the music signal are added to the sound generator, the offensive feel of the patient can further be mitigated.

(g) As another means for cancelling the noise, the error signal detector is disposed away from the ears of the patient and outside the chamber, the noise cancellation signal is corrected by the transmission coefficient between the ears and the error signal detector, and furthermore, all of the sound generator, the phase/amplitude control circuit, the driving signal detection circuit and the error signal detection circuit are also disposed outside the chamber. According to this arrangement, disturbance of the magnetic field applied to the patient does not occur and the drop of image quality can be prevented.

BRIEF DESCRIPTION OF THE DRAWINGS

FIG. 19 is a diagram showing a signal processing performed in the ANC.

DESCRIPTION OF THE PREFERRED EMBODIMENTS

Figure 1:
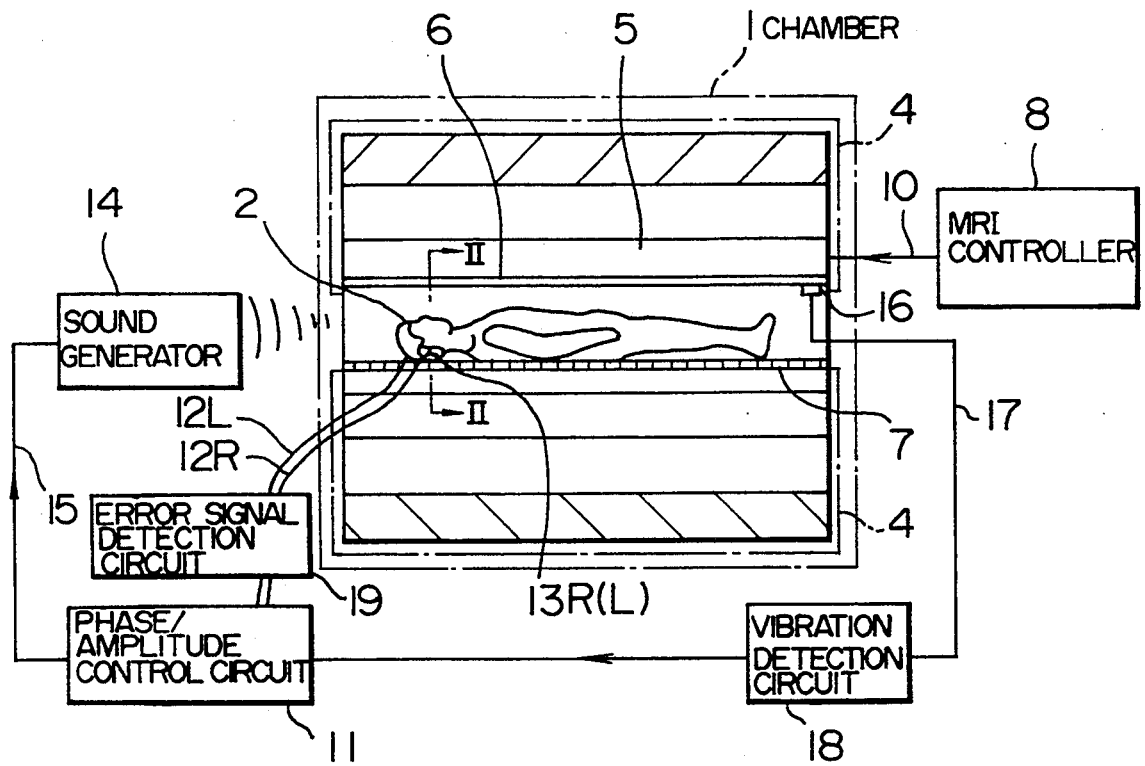
FIG. 1 is a schematic view showing an MRI apparatus according to the first embodiment of the present invention.
Figure 2:
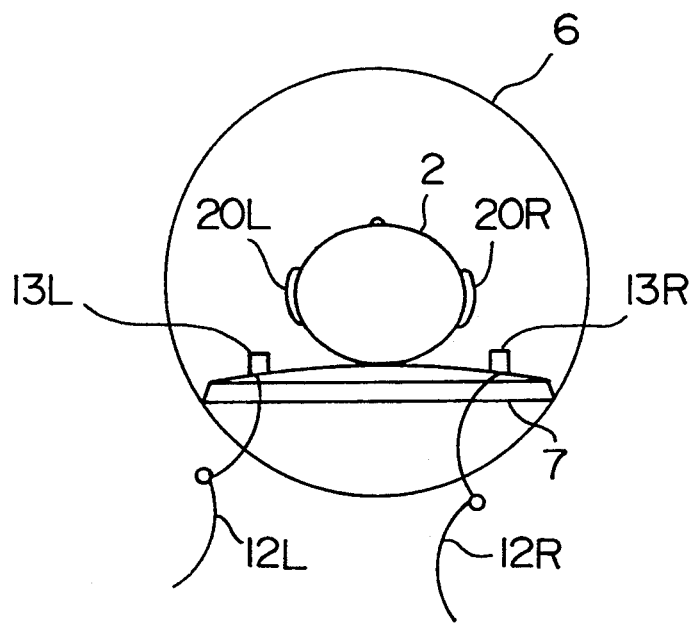
FIG. 2 is a sectional view taken along a line II—II of FIG. 1.

Hereinafter, preferred embodiments of the present invention will be explained with reference to the accompanying drawings. FIG. 1 is a schematic view of an MRI apparatus according to the first embodiment of the present invention and FIG. 2 is a sectional view taken along a line II—II of FIG. 1.

As depicted in FIG. 1, the MRI apparatus according to the first embodiment includes a chamber 1, a cylindrical bobbin 6 disposed at the center of the chamber 1 and having therein side a space for accomadating a patient 2, a gradient field coil 5 flexed around the outer periphery of the bobbin 6, and an electromagnet 4 surrounding the gradient field coil 5, as the constituent members associated with medical treatment. The patient 2 is allowed to lie down on a table 7 disposed inside the cylindrical bobbin 6.

Capacitance type microphones 13R and 13L are disposed close to both ears of the patient 2 on the table 7 to detect noise, and a piezoelectric type vibration acceleration pickup 16 is fitted to the inner surface of the bobbin 6 to detect vibration of the bobbin 6. An error signal detection circuit 19 connected to the microphones 13R, 13L through cables 12R, 12L, respectively, and a vibration detection circuit 18 connected to the pickup 16 through an output cable 17, are disposed outside the chamber 1. There are further disposed a phase/amplitude control circuit 11 for inversing the phase of the signal from the vibration detection circuit 18 and rendering its amplitude proportional to the magnitude of the signal from the error signal detection circuit 19 and a sound generator 14 for generating a sound which cancels the noise on the basis of a sound cancellation signal from the phase/amplitude control circuit 11.

The diagnostic operation of the MRI apparatus described above will be explained. An electric signal is transmitted from an MRI controller 8 through a cable 10. When this electric signal flows through the gradient field coil 5 and the electromagnet 4, a gradient electric field and a radio frequency (RF) magnetic field are applied to the body of the patient 2 inside the bobbin 6. The atomic nucleus of hydrogen inside the body of the patient causes nuclear magnetic resonance due to this magnetic field and consequently, a weak electromagnetic wave is generated from the body. The NMR signal comprising this electromagnetic wave is detected and is processed by a computer (not shown in the drawings), and a tomogram of the body can be obtained by imaging data relating to the proton density inside the body and to the distribution of the relaxation time.

Measurement is repeated hundreds of times in order to collect one slice data required for imaging a slice of the body. Since a single measuring time is about 1 second, several minutes time is necessary for imaging one slice (section). Furthermore, since the addition mean of the measurement values is calculated so as to improve S/N (signal-to-noise ratio), the imaging time is further elongated. During the operation of this apparatus, the bobbin 6 is vibrated by the electromagnetic force and this vibration in turn generates repeatedly a big noise for a long time and inflicts great pain on the patient 2.

In this embodiment, the pickup 16 detects vibration acceleration of the bobbin 6 and its output is sent to the vibration detection circuit 18 through the cable 17 and is amplified by this circuit 18. The phase and amplitude of the output are adjusted by the phase/amplitude control circuit 11. The sound generator 14 for cancelling the noise generates the sound for cancelling the noise on the basis of the signal which is adjusted by the phase-/amplitude control circuit 11. The microphones 13R, 13L disposed close to the ears 20R, 20L of the patient 2 pick up the combined sound of the noise and the sound from the sound generator 14 near the ears 20R, 20L and transmit error signals to an error signal detection circuit. 19 through the output cables 12R, 12L, respectively.

The phase/amplitude control circuit 11 inverses the phase of the vibration signal, increases of decreases the vibration amplitude in proportion to the magnitude of the error signal resulting from the noise, and operates so as to minimize the amplitude value of the output signal of the error signal detection circuit 19 (or in other words, the magnitude of the noise). Here, the term "error signal" represents the signal of each microphone detecting the sound near each ear, and the microphone detects the noise portion which cannot be eliminated by the sound generator.

To detect the vibration as the source for generating the noise, the present invention does not detect the noise itself inside the bobbin 6 generated by the vibration by the microphones, but employs the method which detects the vibration acceleration of the bobbin 6 as shown in FIG. 1. Accordingly, a satisfactory sound cancellation effect can be obtained without generating howling.

The sound generator 14 used for cancelling the noise is disposed outside the chamber 1 in order to prevent any erroneous operation under a high magnetic field and the drop of image quality of the slice of the body. Furthermore, the capacitance microphones 13R, 13L capable of picking up the sound under the high magnetic field are disposed close to both ears of the patient 2 inside the bobbin 6. A miniature electric capacitance microphone having a size of several millimeters is available at present as the capacitance type microphones 13R, 13L. Accordingly, the drop of image quality can be avoided by disposing this microphones 13R, 13L close to the ear of the patient 2. In this embodiment, the open space between the bobbin 6 and the head of the patient 2 is used for non-contacting sound cancellation. However, it is also possible to assemble both the microphones 13R, 13L and the sound generator 14 into a headphone and to put it to the ears, or to assemble them into a headgear style. If the microphones 13R, 13L are fixed to the table 7 for the patient 2 as shown in FIG. 2, the microphones 13R, 13L can also be kept near the ears of the patient 2 even when the patient 2 and the table 7 are move so as to obtain a tomogram of each portion of the body. Incidentally, the sound may be generated by disposing a device which directly vibrates the bobbin 6, as the sound generator. The vibration device can be constituted, for example, by bonding a piezoelectric device to the bobbin, and a voltage is applied to this piezoelectric device.

Figure 3:
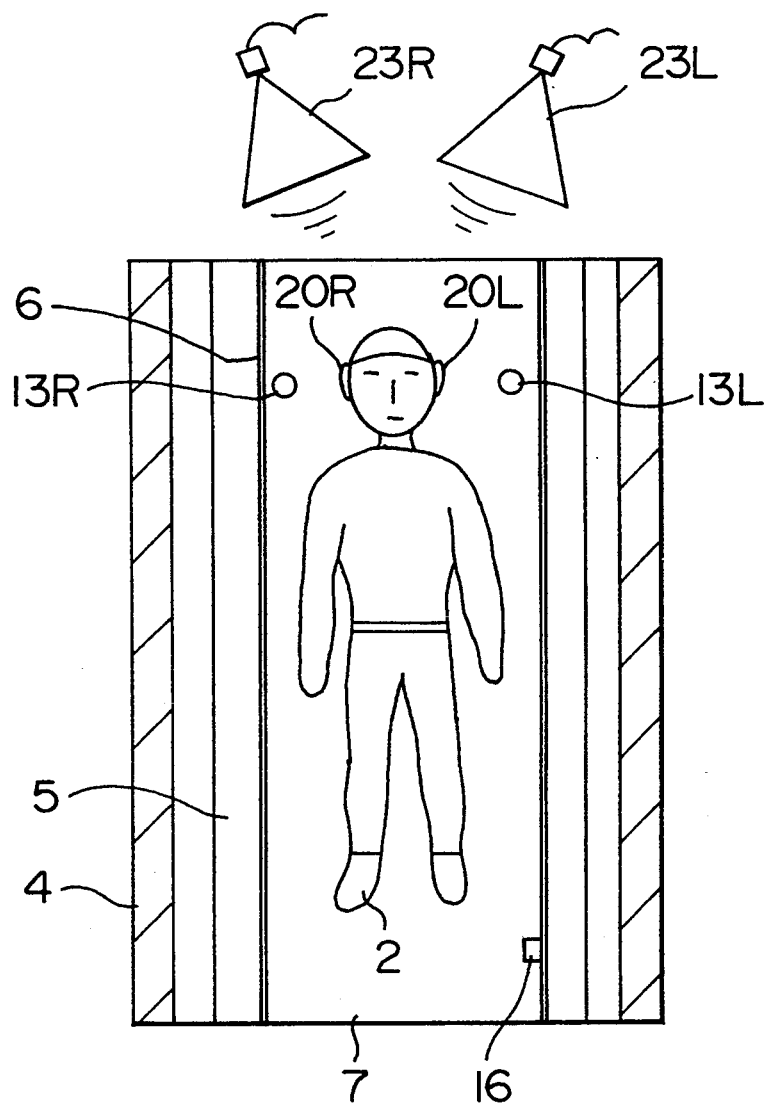
FIG. 3 is a transverse sectional view showing an MRI apparatus according to the second embodiment of the present invention.
Figure 4:
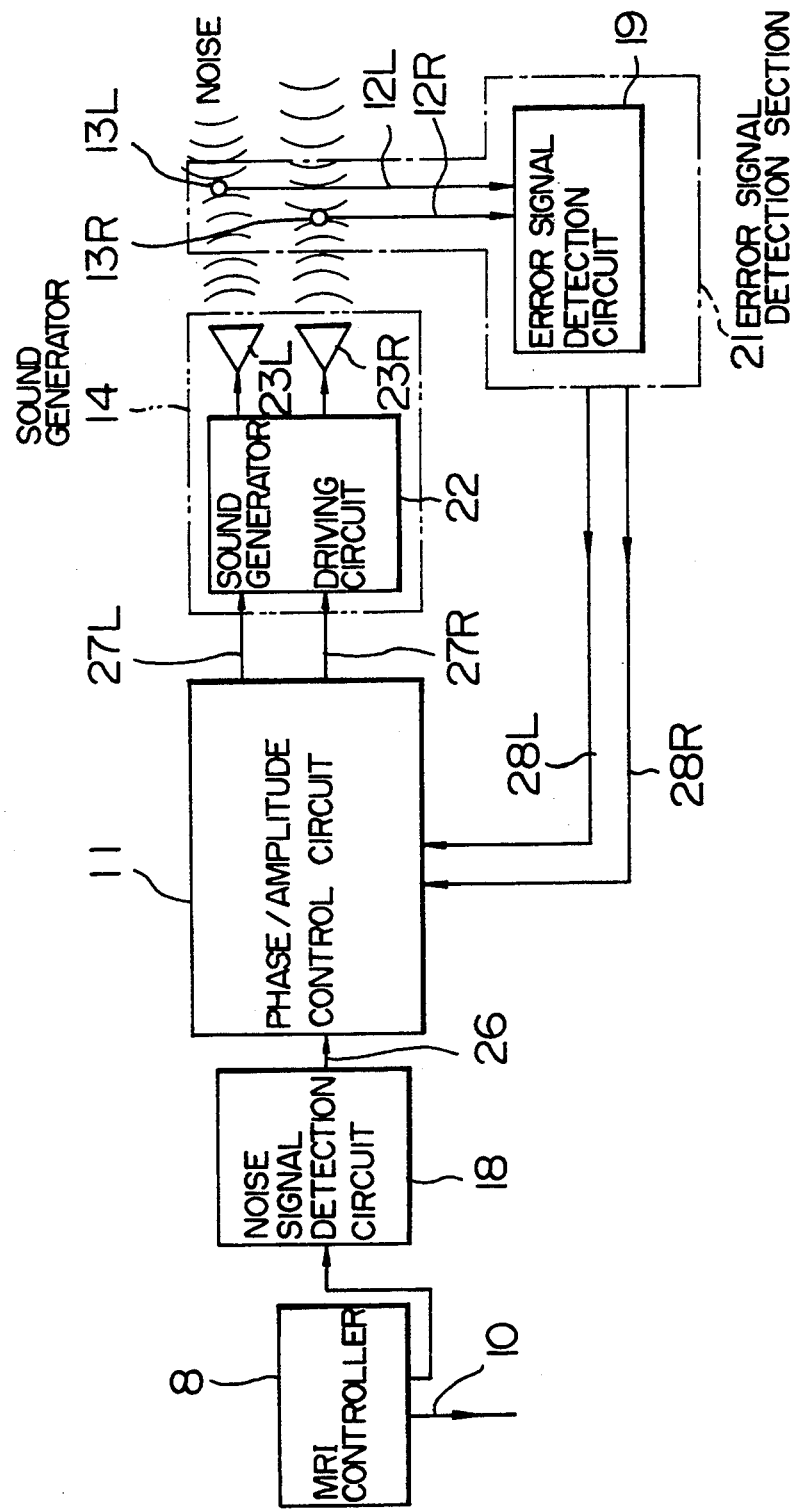
FIG. 4 is a block diagram showing the flow of signal processing in the second embodiment.

Next, the second embodiment of the present invention will be explained with reference to FIGS. 3 and 4. FIG. 3 is a transverse sectional view of the MRI apparatus according to the second embodiment, and FIG. 4 is a block diagram showing the flow of error signal processing. This embodiment is different from the first embodiment in that two sound generators are disposed, that a magnetic control signal outputted from the MRI apparatus is used as a noise original signal and that the phase/amplitude control circuit 11 for controlling the two sound generators is different from that of the first embodiment. With these exceptions, the second embodiment is fundamentally the same as the first embodiment.

In this embodiment, two sound generators 23R, 23L for cancelling the noise are disposed outside the chamber 1 in such a manner as to face two open spaces near the ears 20R, 20L of the patient 2. Accordingly, since the sound wave generated from each sound generator can be controlled individually, the effect of increasing the sound cancellation and the sound cancellation region can be obtained.

The circuit for processing the error signals shown in FIG. 4 comprises an error signal detection unit 21 comprising in turn the two capacitance type microphones 13R, 13L for detecting the two error signals, the cables 12R, 12L for their output signals and an error signal detection circuit 19; a noise source signal detection circuit 18 for detecting the output signal of magnetic control by the MRI controller 8 as a noise source signal; the phase/amplitude control circuit 11 for processing the signals from the error signal detection unit 21 and from the noise source signal detection circuit 18; and the sound generator 14 for cancelling the noise, comprising two sound generators 23R, 23L, and a driving circuit 22 for driving the sound generators 23R, 23L by the signal from the phase/amplitude control circuit 11. The output signal of the MRI controller 8 is a signal which is in synchronism with the start of one slice data collection. The output signal of the MRI controller 8 is inputted as the noise source signal to the phase/amplitude control circuit 11 through the noise source signal detection circuit 18. Therefore, an unstable sound cancellation operation resulting from howling can never occur in the same way as in the first embodiment.

Figure 5:
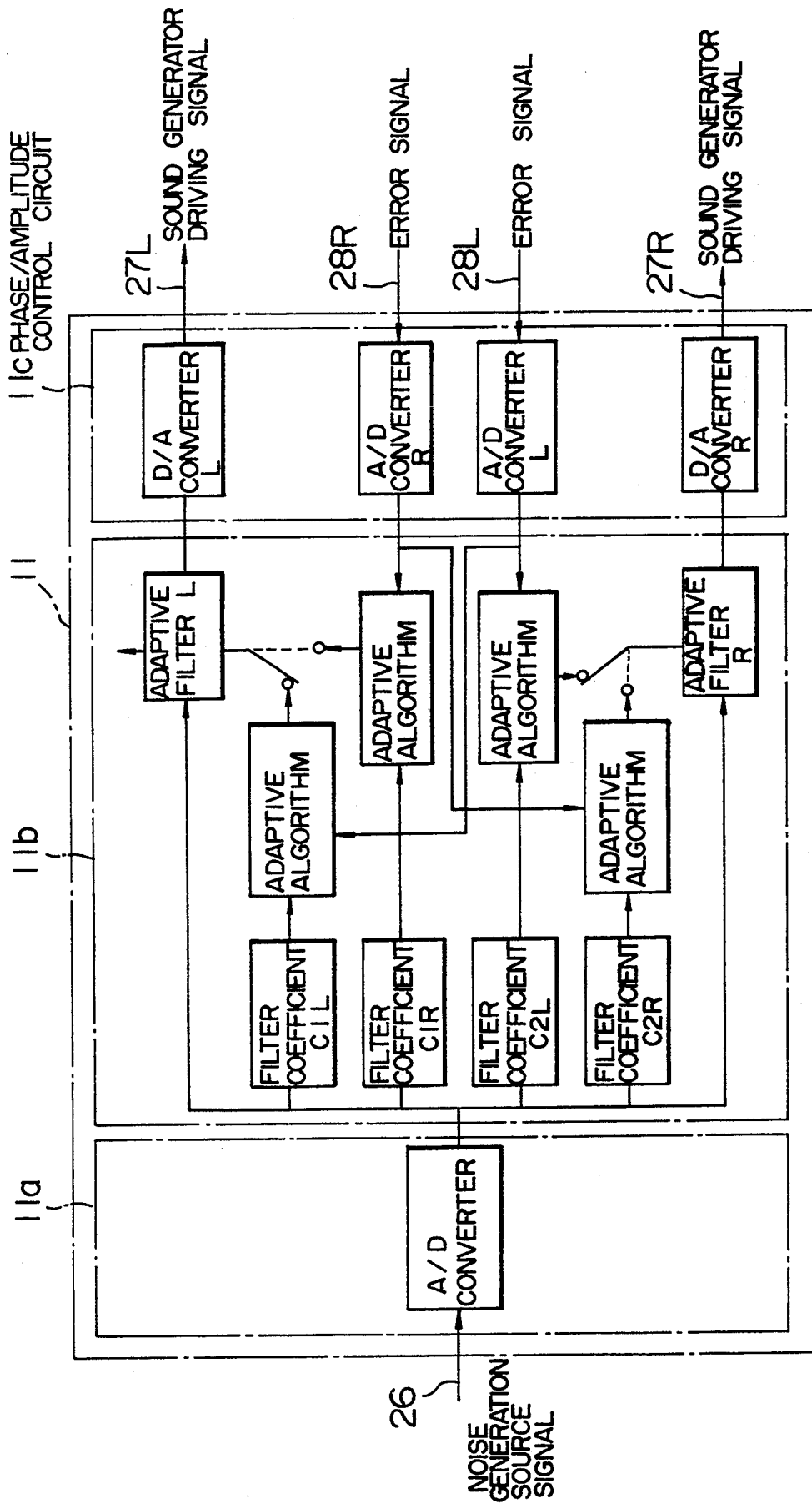
FIG. 5 is a block diagram showing the structure of a phase/amplitude control circuit in the second embodiment.

FIG. 5 is a block diagram showing the structure of the phase/amplitude control circuit 11 of the second embodiment. The drawing represents the example wherein sound cancellation is effected on a time division basis by adaptive control in the two open space regions near the ears of the patient 2 by the use of two error signals 28R, 28L and two sound generator driving signals (sound cancellation signals) 27R, 27L.

Signal conversion circuits 11a, 11c having an A/D conversion circuit for converting an analog signal to a digital signal in the case of an input and a D/A convertor for converting a digital signal to an analog signal in the case of an output are disposed at signal input-output portions of the phase/amplitude control circuit 11, respectively. In this embodiment, the sound wave generated from each of the sound generators propagates to the two microphones for the error signal detection that are disposed in the two sound cancellation regions. Therefore, there occur four propagation routes. In other words, the sound wave from the left sound generator 23L propagates not only to the left microphone 13L but also to the right microphone 13R and similarly, the sound wave from the right sound generator 23R propagates to both of the microphones 13R, 13L. Accordingly, the phase and amplitude adjustment must be made for each of the four routes to cancel the sound in the two regions. Generally, to cancel the sound of n regions by the use of m sound generators, control using an adaptive digital filter such as an adaptive FIR (Finite Impulse Response) filter must be made for each of these m×n routes. When the numbers of sound generators and sound cancellation regions increase, the problems generally develop in that a calculation quantity becomes enormous, the increase in the memory quantity and in the adaptation time is invited, and the application range of the active sound cancellation system is extremely limited. To cope with the problems, the present invention determines a control value as an unknown number on a time division basis and contemplates to shorten the adaptation time.

In the phase/amplitude control circuit 11 of this second embodiment, the number of the adaptive FIR filters is set to be the same as the number of the sound generators, that is, 2. The adaptive FIR filters determine four transmission characteristics between each sound generator and each error microphone, that is, four FIR filters, by correcting with impulse response coefficient vectors C1L, C1R, C2L and C2R (C1L–C2R), for example, for the noise source signal 26. Input signals for driving the respective sound generators 23L, 23R are generated for each combination of the resulting signals and two error signals while switching is carried out whenever data are sampled, on the time division basis. In this case, the filter coefficients of the adaptive FIR filters L, R are made variable by using an adaptive algorithm such as LMS (Least Mean Square) so that the magnitude of the error signal output becomes minimal. The impulse response coefficient vectors C1L–C2R that decide the four FIR filters are obtained in advance by measurement before the diagnosis. When a plurality of portions of the body are diagnosed by moving the positions near the ears of the patient, the impulse response coefficient vectors C1L–C2R are measured in advance whenever the diagnosis is made, and the result of measurement is used. Alternatively, the coefficient vectors C1L–C2R at the ear positions of a plurality of portions of patient are measured and stored in a data base beforehand, and active noise cancellation is carried out in the diagnosis by using every time the coefficient vectors C1L–C2R corresponding to the ear positions of each patient. Storage and write means of the coefficient vectors necessary for this purpose are also embraced in the scope of the present invention, although such a means is not illustrated in the drawings.

In the block diagram shown in FIG. 5, the phase/amplitude control circuit 11 can be accomplished by a high speed digital signal processor (DSP), an A/D convertor and a D/A convertors as the hardwares and a software for controlling these hardwares. According to this structure, the calculation quantity for the time division adaptive control does not much increase even when the numbers of the sound generators and noise cancellation regions are increased. Accordingly, it is possible to prevent the limitation of the application range and the increase of the cost resulting from the increase in the memory capacity and in the adaptation time, and the drop of the noise cancellation effect.

Figure 6:
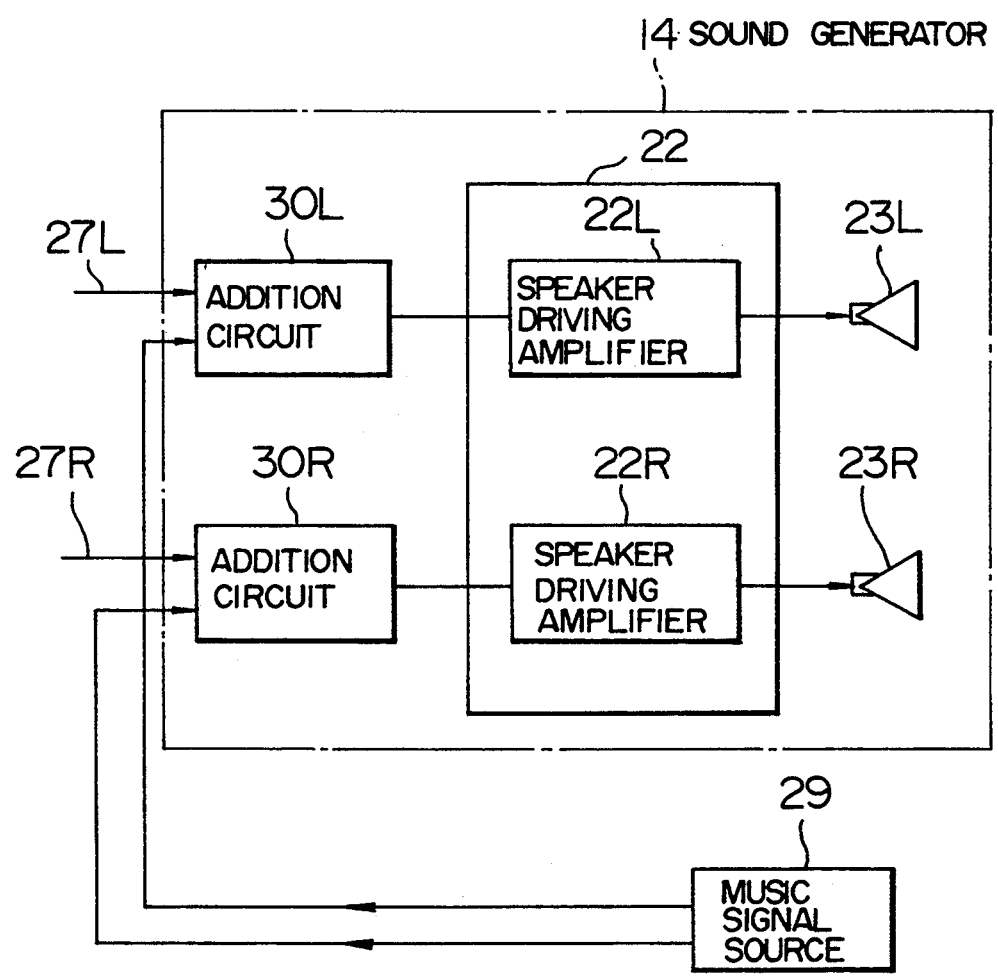
FIG. 6 is a signal block diagram of a sound generator 14 in the third embodiment of the present invention.

Next, the third embodiment of the present invention will be explained with reference to FIG. 6. FIG. 6 is a signal block diagram of the sound generator 14 for cancelling the noise. The MRI apparatus according to this embodiment is produced by adding the following music function to the apparatus of the second embodiment. The sound generator 14 of this embodiment employs the structure wherein an addition signal of the noise cancellation signals 27R, 27L and an output signal of a music signal source 29 are generated by addition circuits 30R, 30L, this signal is used for driving the speaker driving amplifiers 22R, 22L and the sound is generated from the sound generators 23R, 23L.

This active noise cancellation system is the one that cancels only a sound wave having high correlation-ship with the noise source signals among the sound waves near the ears of the patient 2, and the vibration of the bobbin 6 or the output signal of the MRI controller 8 is used as the noise source signal. Therefore, among the sound waves generated from the sound generators 23R, 23L, the music is not cancelled but is as such transmitted to the patient 2. As a result, since this music can mask the noise, its noisiness can be mitigated and the patient is eventually freed from offensive noise. Furthermore, a data transmission signal to the patient 2 can be added to the noise cancellation signal by the use of other signal source in place of the music signal source 29.

Figure 7:
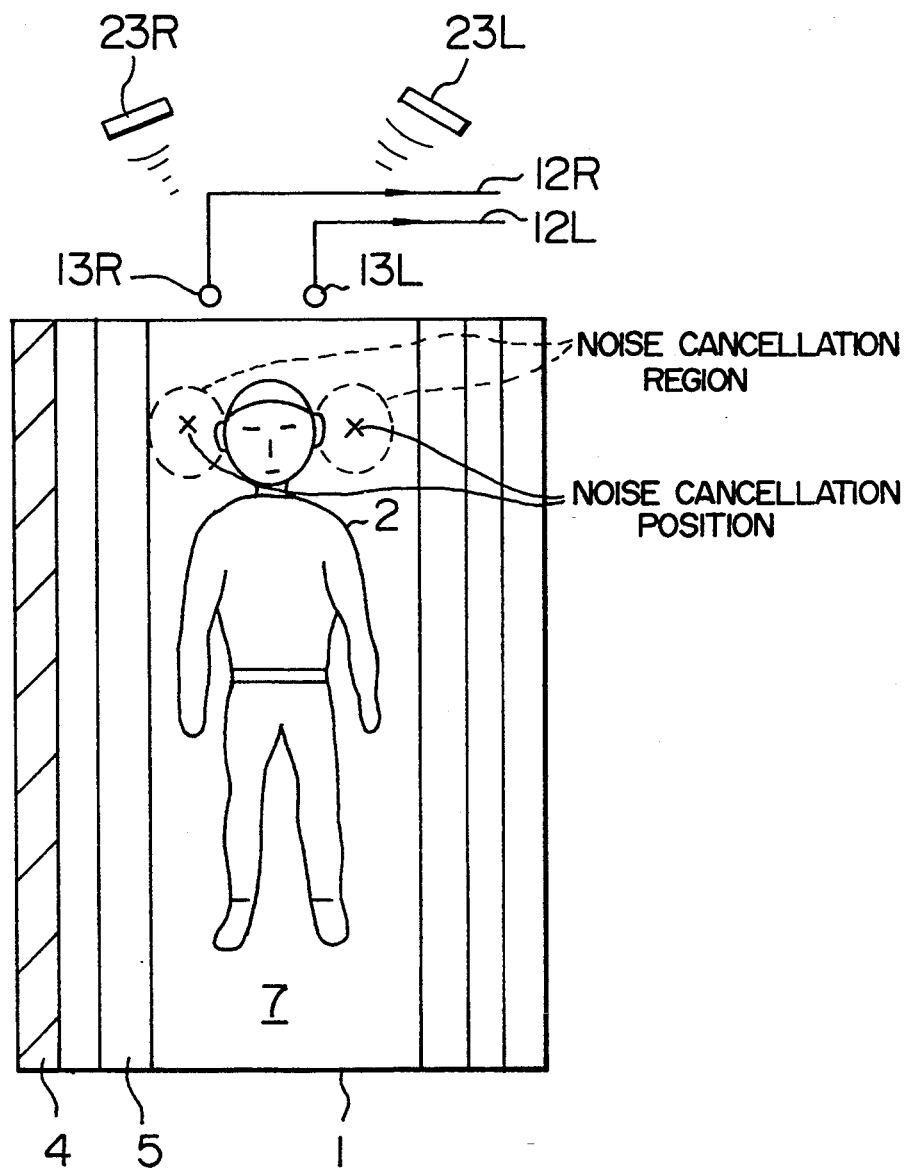
FIG. 7 is a transverse sectional view of an MRI apparatus according to the fourth embodiment of the present invention.
Figure 8:
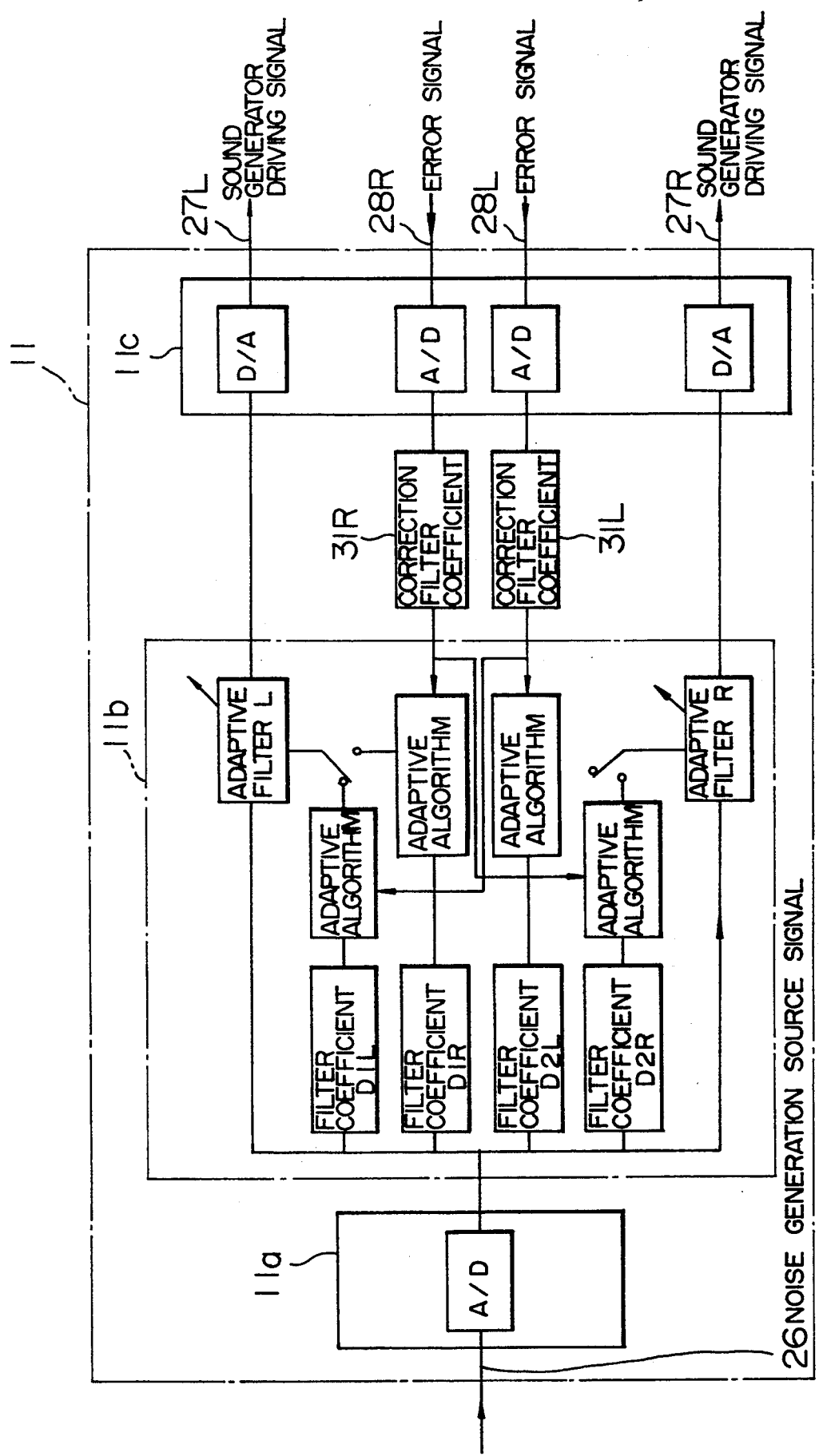
FIG. 8 is a signal block diagram of a phase/amplitude control circuit in the fourth embodiment.

The fourth embodiment of the present invention will be explained with reference to FIGS. 7 and 8. FIG. 7 is a transverse sectional view of the MRI apparatus according to the fourth embodiment and FIG. 8 is a signal block diagram of the phase/amplitude control circuit 11. As shown in FIG. 7, this embodiment cancels the noise near the ears of the patient 2 by disposing the microphones 13R, 13L for picking up the error signals in the spaced-apart relation from the noise cancellation regions near the ears of the patient 2. Only the patient 2 exists inside the bobbin 6, and no other ANC members such as the microphones exist. In this embodiment, the microphones 13R, 13L for detecting the error signals, their output cables 12R, 12L and the sound generators 23R, 23L for cancelling the noise are disposed outside the chamber 1. The MRI apparatus of this embodiment is the same as that of the second embodiment with the exception that the microphones for detecting the error signals are disposed outside the chamber 1 and that correction filters of the phase/amplitude control circuit 11 are disposed as will be explained below.

In FIG. 8, the filter coefficients D1L, D1R, D2L and D2R represent that impulse response coefficient vectors between the sound generators 23R, 23L and the sound cancellation positions at both ears of the patient 2. Reference numerals 31R and 31L denote correction filter coefficients that are obtained by inverse Fourier transform of the ratio of the noise spectrum at the sound cancellation positions and at the positions of disposition of the microphones 13R, 13L.

Noises are generated from the microphones 13R, 13L when the signal is applied to the gradient magnetic field coil 5. To cancel the noise near the ears, the transmission characteristics of the sound wave between the ears and the microphones 13R, 13L must be determined because the ears and the microphones are spaced apart from one another. Therefore, two other microphones are disposed at the sound cancellation positions near the ears of the patient only during the preliminary operation before the start of the diagnosis and each noise spectrum is measured. Then, the correction filter coefficients 31L, 31R can be obtained by executing the calculation described above. Accordingly, the correction filter coefficients 31R, 31L represent the impulse response coefficient vectors between the two other microphones and the two normal microphones 13R, 13L. Transmission characteristics between the separate or normal microphones can be measured by a measuring method which uses the normal or separate microphones as the speaker by utilizing reversibility of the capacitance type microphones and irradiates M series modulation signal sound as a kind of random signals having a long cycle before the operation.

When the MRI apparatus is constituted using the output signal of the MRI controller 8 as the noise source signal and the microphones 13R, 13L as well as the sound generators 23R, 23L outside the two regions near the ears of the patient 2 and outside the chamber 1, remote cancellation of the noise near both ears of the patient 2 can be made by the noise canceller outside the chamber. In this way, the factors for the drop of diagonal performance can be completely eliminated, and there are no members other than the bobbin 6 and the table 7 that restrict the posture, position and size of the patient 2.

Figure 9:
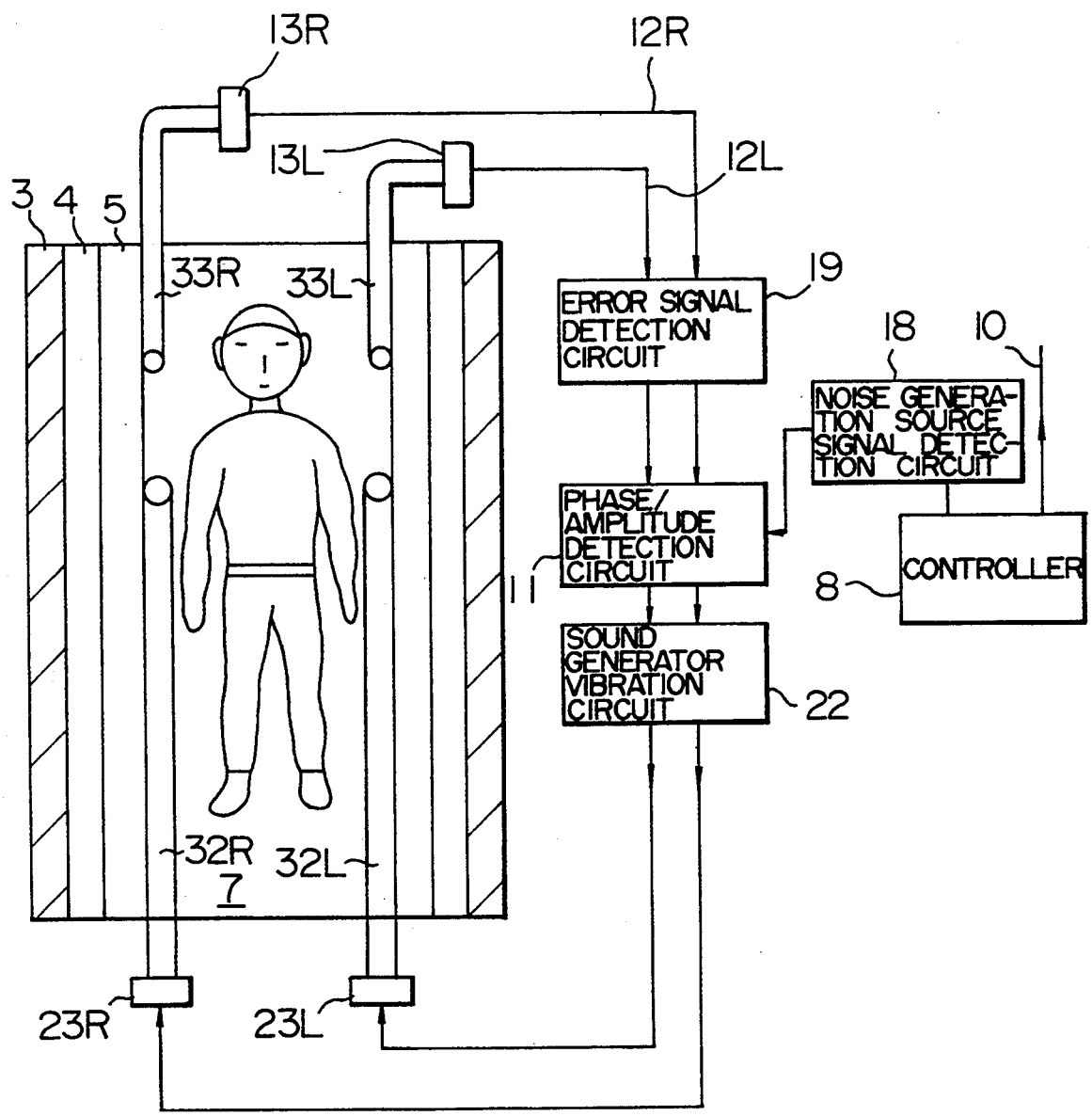
FIG. 9 is a transverse sectional view of an MRI apparatus according to the fifth embodiment of the present invention and a signal processing block diagram.

Next, the fifth embodiment of the present invention will be explained. FIG. 9 is a transverse sectional view of the MRI apparatus according to the fifth embodiment and is also a signal processing block diagram. The microphones 13R, 13L and the sound generators 23R, 23L are disposed outside the chamber 1, and hollow tubes 33R, 33L, 32R, 32L made of a non-magnetic and non-metallic material such as a plastic material are fitted to the tips of these microphones and sound generators. The inside of these tubes is used as a transmission passage of the sound wave. This embodiment is fundamentally the same as the fourth embodiment except that the tubes are employed. This embodiment uses the output signal 10 of the MRI controller 8 for the noise source signal, but the signal of the vibration acceleration of the wall surface of the bobbin 6 can also be used. When the mouth of one of the ends of each tube is positioned inside the chamber 1 and the tube is used as the sound wave transmission device, the noise near the ears of the patient can be cancelled. Moreover, because the metal and the magnetic material do not exist inside the bobbin 6, no disturbance occurs in the magnetic field and eventually, diagnostic performance is not affected adversely, and high image quality can be obtained. Incidentally, the present invention embraces within its scope the modified embodiment wherein the hollow tubes 32R, 32L connected to the sound generators are not used but only the hollow tubes 33R, 33L connected to the microphones are used, and the sound generators are disposed outside the chamber 1. According to this method, too., the sound cancellation effect does not much change as already described.

Figure 10:
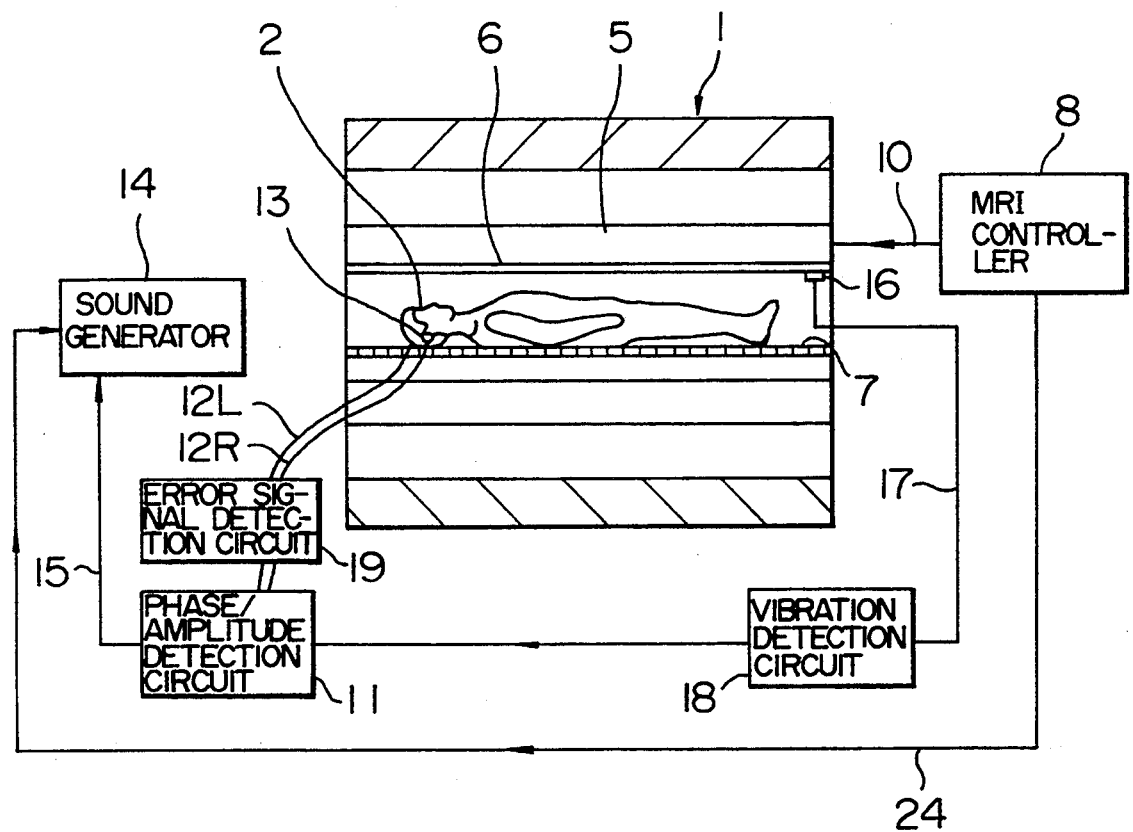
FIG. 10 is a longitudinal sectional view of an MRI apparatus according to the sixth embodiment of the present invention and a signal processing diagram.
Figure 11:
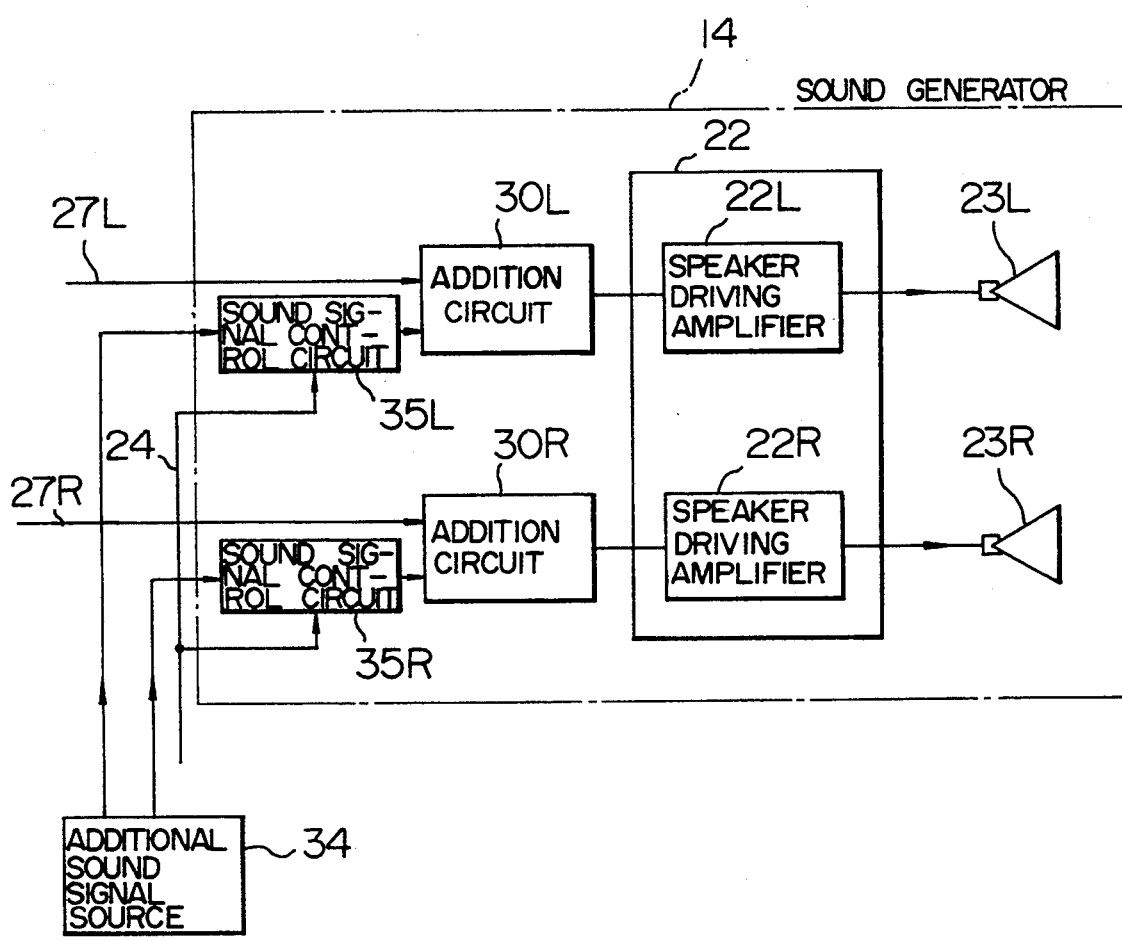
FIG. 11 is a signal processing block diagram of a sound generator in the sixth embodiment.

Next, the sixth embodiment of the present invention will be explained with reference to FIGS. 10 and 11. FIG. 10 is a transverse sectional view of the MRI apparatus of the sixth embodiment and a block diagram of a signal processing circuit. FIG. 11 is a signal block diagram of the sound generator 14 for cancelling the noise. Sound volume and quality near the ears of the patient 2 are changed by the sound generator 14 on the basis of the signal 24 representing the condition of the patient, e.g. the degree of the blood flow of the diseased part obtained by the diagnosis, and the diagnosis of the patient 2 under various acoustic conditions inside the bobbin 6 can be executed. This embodiment is the same as the second embodiment except that sound volume and quality of the sound generator 14 are made variable depending on the condition of the patient 2.

In FIG. 11, the signals outputted from an addition sound signal source 34 and inputted to the addition circuits 30R, 30L are controlled by the sound signal control circuits 35R, 35L on the basis of the output 24 of the MRI controller 8. These signals and the noise cancellation signals 27R, 27L are added by the addition circuits 30R, 30L, respectively, and are guided to the sound generators 23R, 23L through the speaker driving amplifier 22. Since the output signal 24 of the MRI controller 8 is not correlational with the noise source signal, the output signals of the sound signal control circuits 35R, 35L can be controlled independently of the noise. In addition to the sound wave for cancelling the noise, the sound wave generated by the sound generators 23R, 23L contain a sound wave giving a stimulating or pleasant feel to the patient 2.

The present invention embraces within its scope the method using a piezoelectric speaker as the sound generator and the speaker in this case can avoid the influences of magnetism even when placed inside the chamber 1. Accordingly, a stable operation can be carried out.

Figure 12:
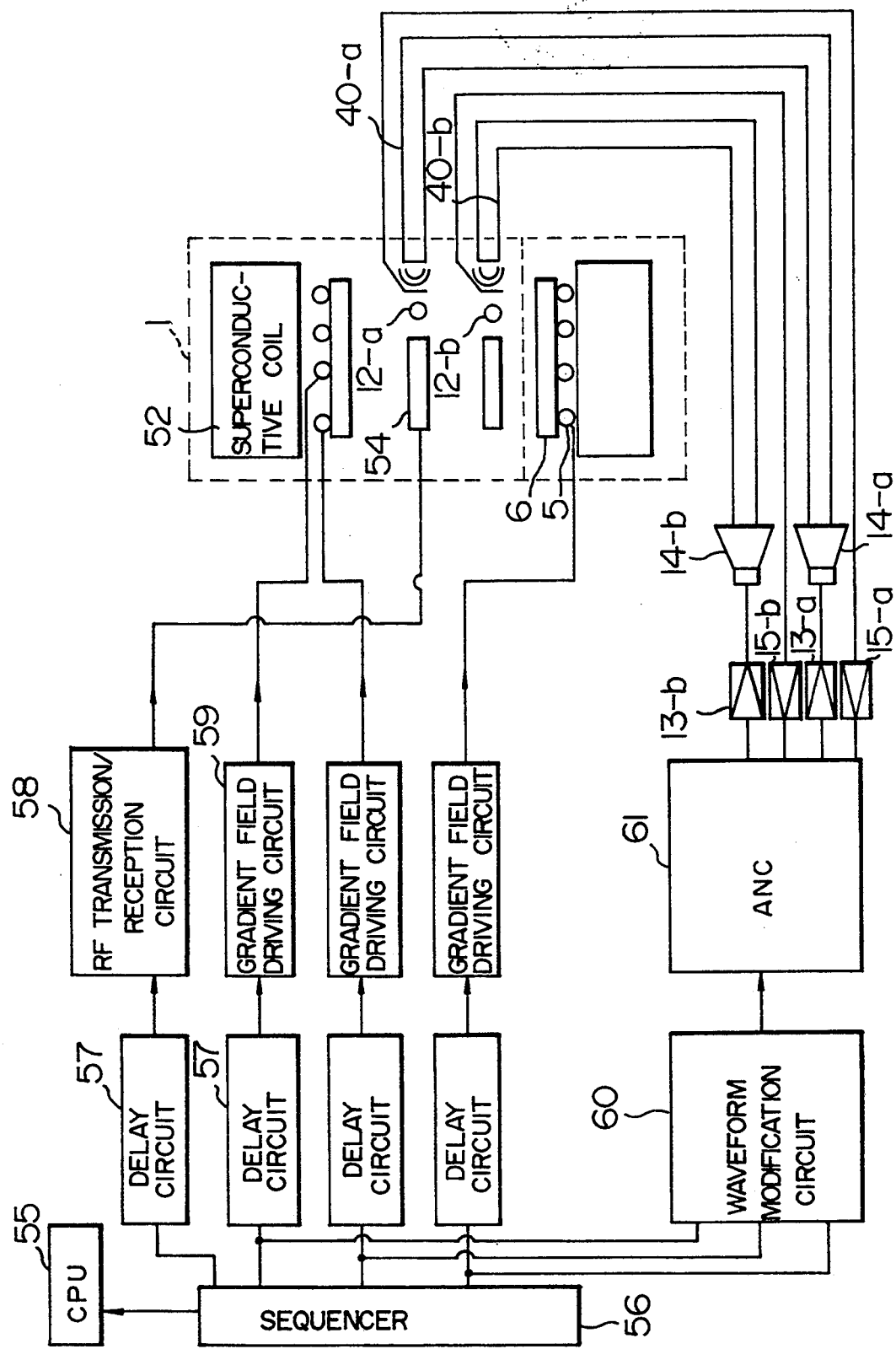
FIG. 12 is a block diagram of an MRI apparatus according to the seventh embodiment of the present invention.

FIG. 12 is a block diagram showing the seventh embodiment of the present invention. In this embodiment, the driving signal to the driving circuit of the MRI apparatus is branched, and one of the branched signals is inputted to the driving circuit of the MRI apparatus through a delay circuit with the other, to the ANC as a noise source signal.

The ANC generates a reference signal stressing a frequency component having a high noise level by processing the inputted driving signal to improve frequency characteristics.

A noise cancellation signal having the phase and amplitude for cancelling the noise occurring actually is generated from this reference signal and the detection signal from the error signal detector.

To have this embodiment more fully understood, the active noise cancellation operation will be explained about the case of one-input one-output apparatus. In active noise cancellation systems in general, the output y of the sound generator is given below when the reference signal is $X_i$ (i=1, 2, ..., N), the adaptive filter coefficient is $W_i$ (i=1, 2, ..., N) and the transmission characteristics from the sound generator to the receiver is $C_i$ (i=1, 2, ..., N):

$$y = \sum_{i=1}^{N} W_i \times X_i \quad (1)$$

It is a convolution integration of the adaptive filter coefficient W and a reference signal X. This adaptive filter coefficient W starts with a suitable initial value and is so controlled adaptively as to minimize the output of the receiver. Although there are various algorithms for this purpose, the explanation will be hereby given on the case using the filtered-x LMS. When a virtual input is $R_i$ (i=1, 2, ..., N) and the output of the error signal detector is e, the updating algorithm of W in this algorithm can be expressed as follows: At first, $R_1$ is obtained by the equation (2). After replacing $R_2$, $R_3$, ..., $R_N$ by old, $R_1$, $R_2$, ..., $R_{N-1}$, the equation (3) is calculated.

$$R_1 = \sum_{i=1}^{N} C_i \times X_i \quad (2)$$

$$W_i = W_i + \mu R_i e \quad (i = 1, 2, \ldots, N) \quad (3)$$

When this procedure is sequentially repeated while obtaining the data, the output of the error signal detector drops gradually.

When this algorithm is applied, the sound in the sound reception zone does not decrease depending on sound characteristics due to the time delay resulting from the time required for calculation and from the filters (low-pass filters: LPF) disposed before and after the A/D convertor of the apparatus. When a noise having a regular waveform such as a sinusoidal wave is cancelled, the noise cancellation effect can be obtained by applying a sound having an opposite phase to the phase of the sound arriving from the noise source with a suitable delay time even though the sound from the sound generator is somewhat retarded. In the case of random sounds, however, a sufficient noise cancellation effect cannot be obtained unless the reference signal X is sufficiently quick, because the sound leaving the sound generator is retarded time-wise from the sound from the noise source for the reason described above and because it is difficult to provide the sound from the sound generator with the opposite phase to that of the sound arriving from the noise source.

To cope with this problem, this embodiment employs the structure shown in FIG. 12.

Hereinafter, the structure of this embodiment will be explained in detail with reference to FIG. 12.

The chamber 1 includes a superconductive coil 52 for generating a static magnetic field, a gradient magnetic field coil 5 capable of generating gradient magnetic fields in X, Y, Z axes, the cylindrical bobbin 6 for supporting the gradient magnetic field coil 5 and a casing (not shown). A radio frequency (RF) transmission/reception coil 54 carried into the apparatus in accordance with the portion of diagnosis of the patient is fixed to the table (not shown) inside the bobbin 6. A CPU 55 for controlling and executing the diagnosis sends a selection instruction signal of a diagnostic mode to a sequencer 56. The sequencer 56 sends a predetermined signal to the RF transmission/reception circuit 58 through a delay circuit 57 and another signal to corresponding gradient field driving circuits 59 through three delay circuits 57, respectively. The delay quantity of these delay circuits 57 may be variable.

On the other hand, a part of the output of the sequencer 56 is inputted to a waveform modification circuit 60 equipped with filters having predetermined frequency characteristics for signals of the three axes and having an addition function, without passing through the delay circuits 57. These output signals are converted to one output signal by the waveform modification circuit 60 and this output signal is inputted to the ANC 61. Signals of two microphones 12-a, 12-b disposed near the RF transmission/reception coil 54 are amplified by amplifiers 15-a, 15-b and are inputted to the ANC 61. The signals generated by the ANC 61 are amplified by amplifiers 13-a, 13-b, are then sent to electrokinetic type speakers 14-a, 14-b and generate actual sound. The sound thus generated reaches the bobbin through rubber tubes 40-a, 40-b fixed to the electrokinetic type speakers and communicating with the bobbin 6, and is so controlled as to possess the same amplitude as, but the opposite phase to, the noise reaching from the noise source at the positions of the two microphones 12-a, 12-b. Here, the electrokinetic speakers 14-a, 14-b are disposed at the positions where they are not affected by the magnetic field. In this embodiment, the speakers are disposed at the positions where the magnetic flux density is below 5 Gausses and the full length of the tubes is about 7 m. The signal from the sequencer 56 is sent to both the gradient field driving circuit 59 and the RF transmission/reception circuit 58 through the delay circuit 57 so as to retard the noise generated from the gradient magnetic field coil 5. In contrast, the input to the ANC 61 has an earlier timing time-wise than the occurrence of the corresponding noise. In other words, the delay time in the delay circuit 57 is set to be about 25 ms so that the delay time is greater than the delay of the active noise cancellation system as a whole that results from the response delay in the microphones 12-a, 12-b and in the electrokinetic speakers 14-a, 14-b, the delay occurring in the low-pass filters inside the ANC 61, the calculation processing time of the ANC 61, the propagation time of the sound wave from the electrokinetic speakers 14-a, 14-b to the microphones 12-a, 12-b.

Adaptive control is effected in the ANC 61 using the output of the waveform modification circuit as the reference signal so as to minimize the outputs of the microphones 12-a, 12-b, and the electrokinetic speakers 14-a, 14-b are driven. Generally, a sufficient noise cancellation effect cannot be obtained for the random noise unless the noise from the noise source is acquired at an early stage and adaptive control is effected. This embodiment can satisfy this requirement by making the delay time of the delay circuit 57 greater than the time delay of the overall system. Since the gradient field driving signal is used as the reference signal but not the noise signal itself, it is possible to prevent howling generated due to circulation of the sound when the noise signal is used as the reference signal.

Incidentally, the sound may be generated by disposing a device which directly vibrates the bobbin 6, as the sound generator. The vibration device can be constituted, for example, by bonding a piezoelectric device to the bobbin, and a voltage is applied to this piezoelectric device.

As the sound generator, a piezoelectric speaker may be used. In this case, since the speaker is mounted on the chamber, the tube is not necessary.

The delay time of the delay circuit 57 is set to be greater than the sum of the delay time of the electrokinetic type speakers 14-a, 14-b and the time delay due to the propagation of the sound wave from the electrokinetic type speakers 14-a, 14-b to the microphones 12-a, 12-b, or in other words, the time delay of the active noise cancellation system as a whole. Accordingly, the signal as the basis of the noise occurring in the bobbin of the MRI can be used as the reference signal of the ANC 61 at an early timing. As a result, a sufficient time can be acquired for the ANC 61 to generate the signal for cancelling the noise at the microphone portions, response is quick in the adaptive control, and a sufficient noise cancellation effect can be obtained even for the noise having random properties.

The data relating to the time necessary for generating the sound wave having the opposite phase can be eliminated in the adaptive filter coefficient W, and the length of this coefficient W can be reduced by setting the delay time of the delay circuits 57 to be greater than the delay time of the active noise cancellation system as a whole and setting the delay time components appearing in the adaptive filter coefficient W used for the adaptive control zero. Accordingly, the overall calculation quantity necessary for the adaptive control can be reduced and furthermore, a necessary memory capacity can be reduced.

Since the electrokinetic type speakers 14-a, 14-b are disposed at the positions where they are not affected by the magnetic field, they hardly affect the image taken. Since the sound generated from the speakers is sent to the portions near the microphones through the tubes, the sound from the speakers enters the microphones without diffusion. Accordingly, the speaker output can be lowered and the speaker amplifiers can be made compact. If the necessary speaker output is small, the energy of the sound to be added may be small, as well, and the increase of the noise at portions other than near the microphones can be limited. The image is not disturbed because the microphones, too, are disposed outside the RF transmission/reception coil 54.

It is also possible to add the signal generated by the ANC to a signal such as a music signal, and to input the sum signal after amplification to the electrokinetic speakers 14-a, 14-b. According to this arrangement, the noise which is otherwise offensive to the patient can be cancelled and moreover, tone quality of the sound is changed as a whole by the music signal, etc., and the effect similar to the effect of further reduction of the sound can be obtained.

In the present preferred embodiment, alike as shown in FIG. 11, information to be transmitted from an operator to the patient may be added to the output of the electrokinetic type speaker. By such configuration, the information necessary for the patient is effectively transmitted. A music signal may be added to the output of the electrokinetic type speaker. A sound volume and quality to be added may be changed in response to the driving signal. By such configuration, influence of noise which the patient feels is lowered. In this case, a new speaker for transmitting the information above mentioned is not necessary.

Figure 13:
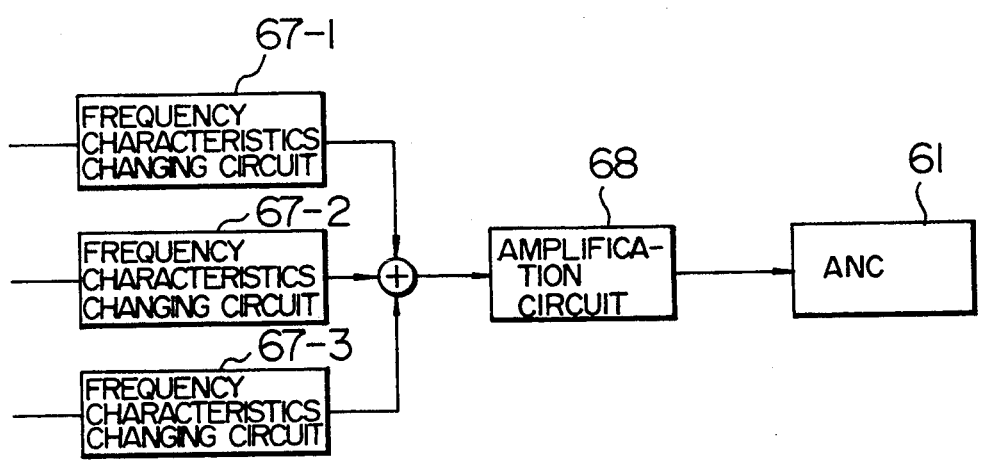
FIG. 13 is a block diagram of a waveform modification circuit according to the seventh embodiment.

FIG. 13 is a block diagram showing the detail of the waveform modification circuit 10 shown in FIG. 12. Three signals from the sequencer 56 are inputted to frequency characteristics changing circuits 67-1, 67-2, 67-3, respectively, and the output signals of the respective frequency characteristics changing circuits 67-1, 67-2, 67-3 are added. After the added signal is amplified by the amplification circuit 68, it is inputted to the ANC 61. Transmission characteristics of the frequency characteristics changing circuits 67-1, 67-2, 67-3 correspond to the transmission functions between the respective gradient field driving signals and the noise. In this way, the signal having substantially the same properties as the generated noise can be inputted to the ANC 61.

The structure described above can anticipate the noise in cooperation with the characteristics of the delay circuit 57 shown in FIG. 12 and can remarkably improve the active noise cancellation effect. Incidentally, although the three frequency characteristics changing circuits 67-1, 67-2, 67-3 having mutually different characteristics are used preferably, they may have the same characteristics if the drop of the noise cancellation effect is permissible to a certain extent. Although the frequency characteristics changing circuits 67-1, 67-2, 67-3 in this embodiment comprise an analog circuit, they may use a digital filter.

Figure 14:
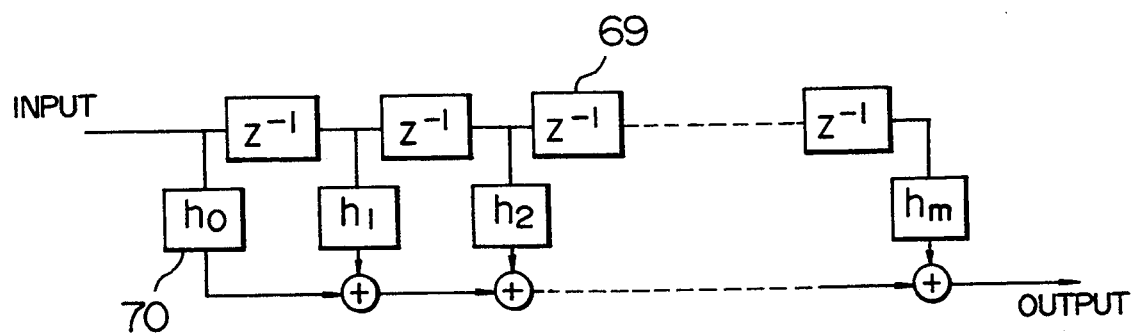
FIG. 14 is a block diagram when a frequency characteristics changing circuit is constituted by a digital filter.

FIG. 14 shows an embodiment wherein the frequency characteristics changing circuit 67 comprises a digital filter. Symbol $z^{-1}$ denotes a delay element 69 and symbol h is a coefficient relating to the data and referred to as a "tap coefficient". Symbol $\oplus$ denotes an adder. According to this structure, a necessary output can be obtained by merely putting a necessary value into the tap coefficient. If the frequency characteristics changing circuits 67-1, 67-2, 67-3 are constituted by a module having the same structure, there can be obtained the advantage that frequency characteristics can be decided freely by simply changing the softwares to be incorporated. Furthermore, the noise signal can be generated by the convolution integration of the frequency characteristics changing circuit input and the tap coefficient by the use of the impulse response value between the gradient field driving signal and the noise as the tap coefficient to be used. Furthermore, characteristics can be determined conveniently by the impulse response between the gradient field driving signal and the noise by the adaptive filter. Furthermore, the stable effect can be expected always because the characteristics can be measured in the practical environment.

As the digital filter, an infinite in pulse response filter (IIR) or a filter considering non-lineality may be used. For example, such a filter can be realized by adding a circuit which operates with non-lineality function to the output of FIG. 14. Of course, a neural network may be used.

Figure 15:
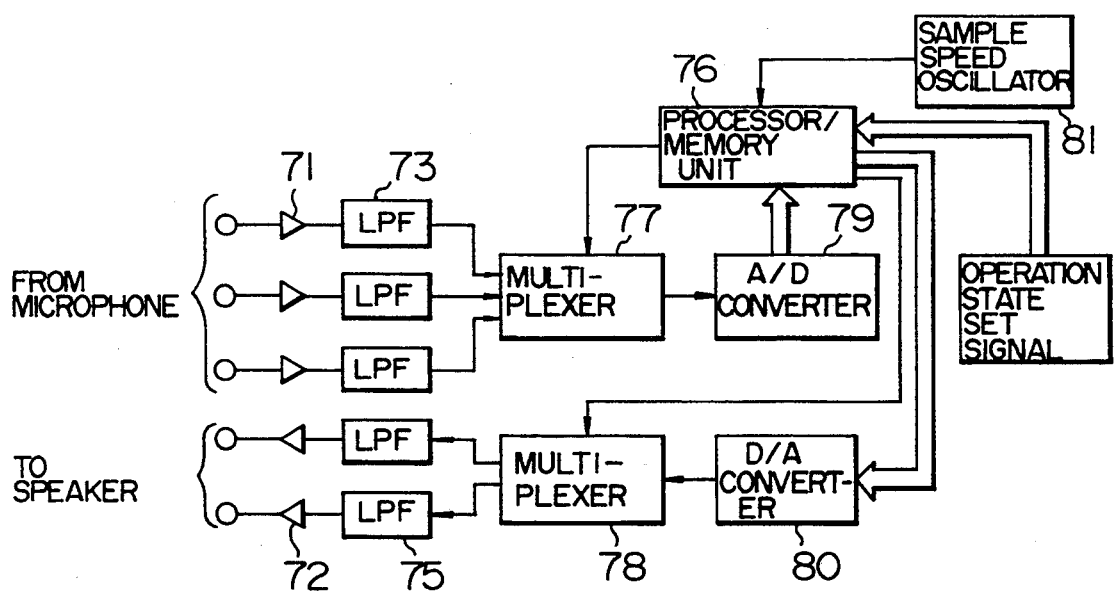
FIG. 15 is a detailed block diagram of an ANC.

FIG. 15 is a block diagram showing in detail the ANC 61 in this embodiment. A processor/memory unit 76 is a one-chip microcomputer referred to as a "digital signal processor", and has therein both the program and data region. Receiving a signal from a sample speed oscillator 81, the processor/memory unit 76 generates a data fetch instruction of the data of the A/D (analog-to-digital) convertor 79 and a D/A (digital-to-analog) convertor 80, and executes processing therein side for active noise cancellation. The content of the internal processing will be described in detail elsewhere.

The signals from the microphones are passed through low pass filters (LPFs) referred to as "anti-aliasing filters" and are inputted to a multiplexer 77. The multiplexer 77 holds the data on the basis of the instruction from the processor/memory unit 76 and transfers analog data to the A/D convertor 79 while switching the data. The A/D convertor 79 digitizes the data and transfers them to the processor/memory unit 76 through a bus line. The data transferred from the processor/memory unit 76 through the bus line are converted to the analog data by the D/A convertor 80, switched by another mutliplexer 78 and are sent to the speakers through the LPFs 75 and the amplifiers 72. The ANC 61 shown in FIG. 15 is formed on one board. The waveform modification circuit 60 may be assembled simultaneously on this board. The CPU 55 of the MRI apparatus sends the data such as the operation mode of the MRI or the kind of the RF transmission/reception coil 4 to the processor/memory unit 76 as the operation condition set signal. The space can be further saved by integrating the members formed on the board into one-chip.

According to the structure described above, the data of the operation condition of the MRI apparatus such as the imaging sequence or the kind of the RF transmission/reception coil can be known, and there can be obtained the advantage that the filter coefficient necessary for processing (or measured in advance) can be selectively used depending on the operation condition of the MRI apparatus, for example, and the noise can be cancelled quickly. Another advantage lies in that a random sound such as an M series sound is generated from the speakers at the initial stage of image processing and the transmission characteristics from the speakers to the microphones can be measured. Predetermined operation instructions may be given directly from the CPU 55 by directly connecting the CPU 55 controlling the operation of the MRI apparatus to the ANC 61 without using the sequencer.

Figure 16:
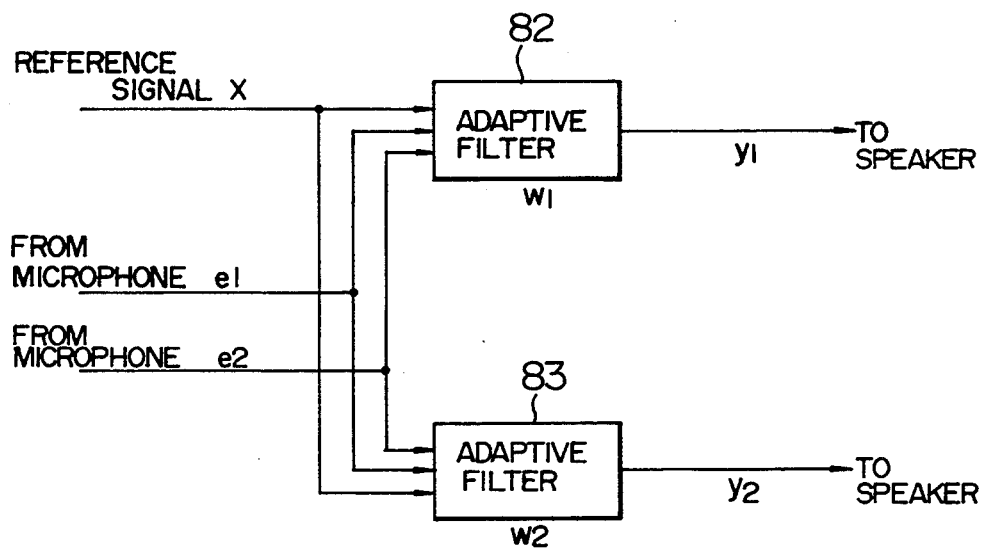
FIG. 16 is a diagram showing the flow of signals at the time of active control.

FIG. 16 shows a fundamental signal processing method of the active noise cancellation incorporated in the processor/memory unit 76. A reference signal X and the outputs $e_1$, $e_2$ from the microphones 12-$a$, 12-$b$ are inputted to the adaptive filters 82, 83, and the outputs of these filters are sent to the two speakers 14-$a$, 14-$b$. Finite impulse response filters (FIR filters) are used for the adaptive filters 82, 83 and the least square mean (LMS) is used as the adaptive algorithm. On other words, the filter coefficient of the adaptive filter is so changed as to make the output of the microphones 12-$a$, 12-$b$ minimum.

The output signals $Y_1$, $Y_2$ to the two speakers are calculated by the following equations (4) and (5):

$$y_1 = \sum_{i=1}^{N} W_{1i} \times X_i \quad (4)$$

$$y_2 = \sum_{i=1}^{N} W_{2i} \times X_i \quad (5)$$

The update formulas of $W_{1i}$ ($i=1, 2, \ldots, N$) and $W_{2i}$ ($i=1, 2, \ldots, N$) are given below where transmission characteristics of the two speakers to the microphones are $C_{11i}$, $C_{12i}$, $C_{21i}$, $C_{22i}$ and the virtual inputs are $R_{11i}$, $R_{12i}$, $R_{21i}$, $R_{22i}$:

$$W_{1i} = W_{1i} + \mu\{R_{11i}e_1 + R_{21i}e_2\} \quad (6)$$
$$(i = 1, 2, \ldots, N)$$

$$W_{2i} = W_{2i} + \mu\{R_{12i}e_1 + R_{22i}e_2\} \quad (7)$$
$$(i = 1, 2, \ldots, N)$$

$$R_{11i} = R_{11(i-1)} \, (i = 2, \ldots, N),$$

$$R_{111} = \sum_{i=1}^{N} C_{11i} \times X_i$$

$$R_{12i} = R_{12(i-1)} \, (i = 2, \ldots, N),$$

$$R_{121} = \sum_{i=1}^{N} C_{12i} \times X_i$$

$$R_{21i} = R_{21(i-1)} \, (i = 2, \ldots, N),$$

$$R_{211} = \sum_{i=1}^{N} C_{21i} * X_i$$

$$R_{22i} = R_{22(i-1)} \, (i = 2, \ldots, N),$$

$$R_{221} = \sum_{i=1}^{N} C_{22i} \times X_i$$

Since the adaptive filter coefficients $W_1$, $W_2$ are changed so as to minimize $e_1$, $e_2$ as expressed by the equations given above, the following effect can be obtained.

When the temperature changes inside the MRI main body, the sound velocity changes and the transmission characteristics of the noise change, too. When the latter changes, the adaptive filter coefficients $W_1$, $W_2$ so change as to reduce the microphone outputs $e_1$, $e_2$ that increase with the temperature rise or drop. Therefore the noise cancellation effect can be maintained.

Figure 17:
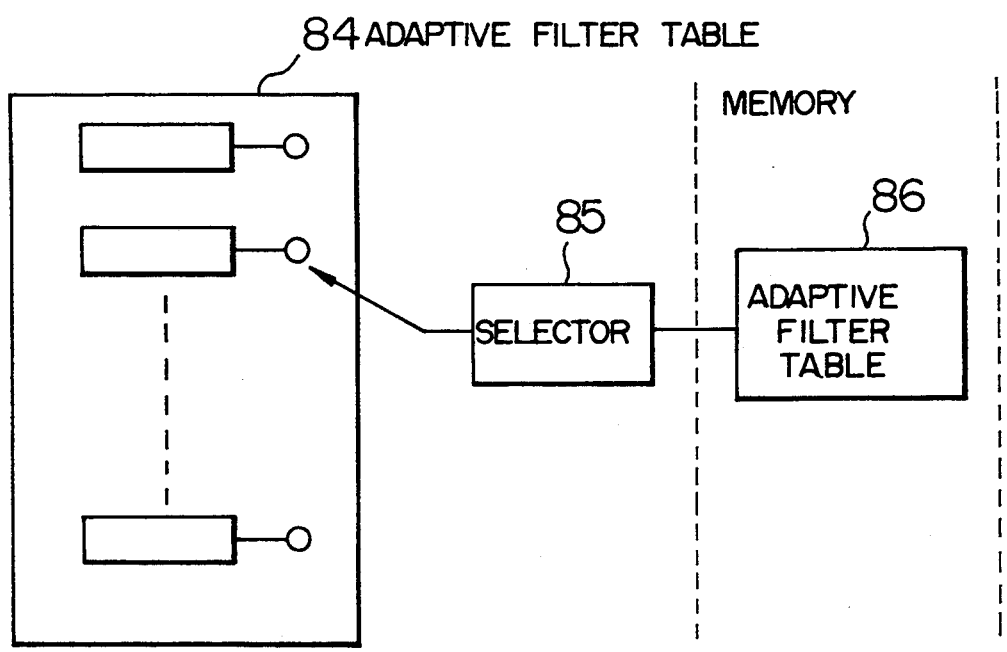
FIG. 17 is a diagram showing an adaptive filter and the flow of data.

An adaptive filter table 84 shown in FIG. 17 is prepared in the memory inside the processor/memory unit 76, and the filter coefficient is stored from the adaptive filter table 84 into the adaptive filter table on the memory used in the practical control on the basis of an instruction of a selector 85. This adaptive filter table 84 stores the coefficient corresponding to the RF transmission/reception coil for use for the head, for example. In the embodiment having the structure described above, the filter coefficient that has sufficiently learned is used for the noise cancellation, and the noise cancellation is started from the state in which the adaptive filter has become adapted to a certain extent. Accordingly, the noise cancellation effect can be obtained quickly. Needless to say, quick correspondence can be made to the case where a new operation mode is employed, if this adaptive filter table 84 has the function of registering new data. The same effect can be obtained for the spatial transmission functions, too, by preparing substantially the structure as the one shown in the drawing.

When the temperature of the room is well controlled, if the sufficiently learned filter coefficients are stored in the adaptive filter table, the noise can be efficiently cancelled only by calculating the output of the speaker. In this case, the error microphone may be removed. In such configuration, there are advantages that the load of operating is decreased for the ANC and that the error microphone and the amplifier are not necessary. Therefore, the active noise cancellation apparatus can be produced with a decreased cost.

Figure 18:
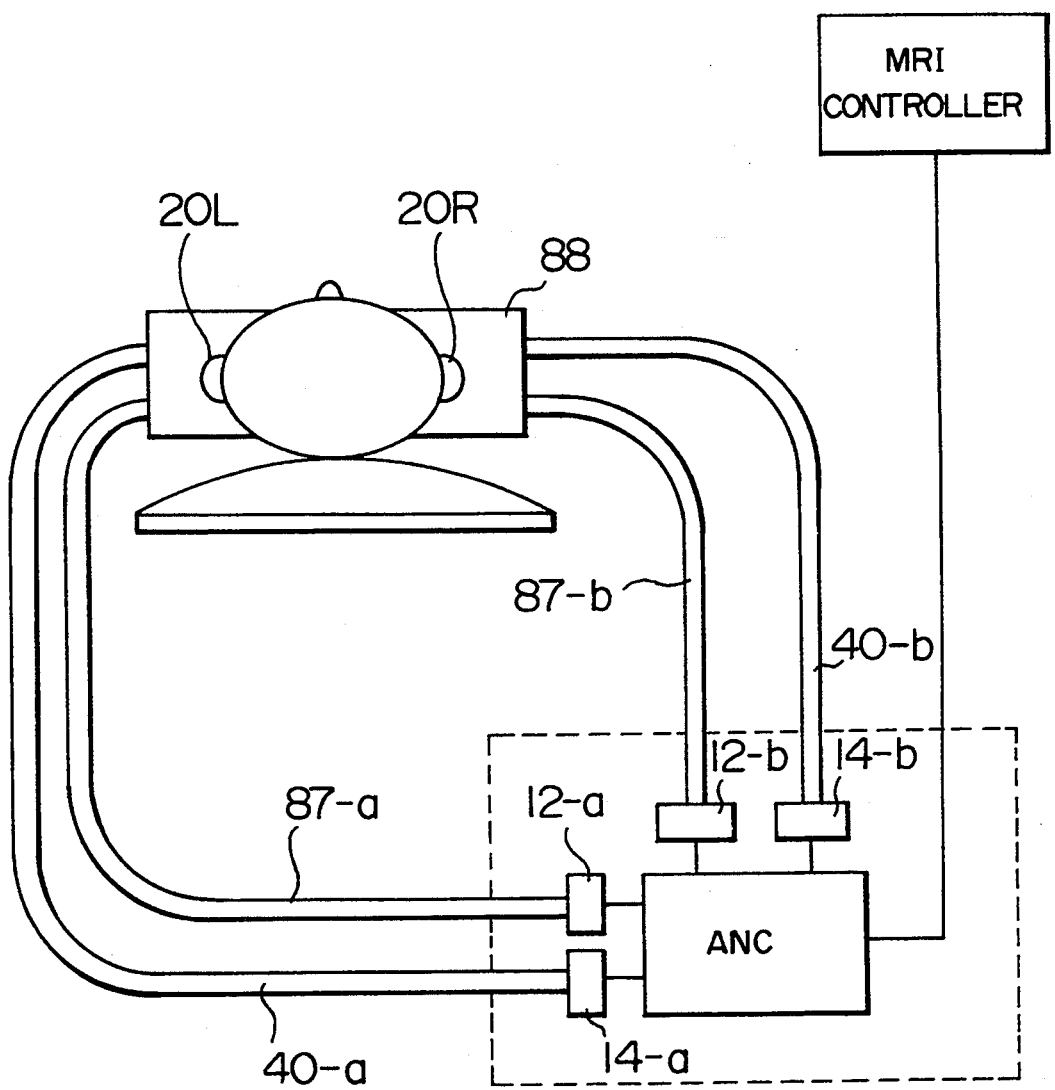
FIG. 18 is a diagram of the eighth embodiment of the present invention.

FIG. 18 shows a block diagram of an eight embodiment. In the embodiment, the driving signal is divided into two paths in the MRI apparatus. The one is delayed and used for driving the MRI apparatus. The other is inputted into the ANC for the noise source signal. In the ANC, a reference signal in which a frequency component corresponding to a high region of a noise level is enhanced is generated by modifying the inputted driving signal and improving the frequency characteristic. The speakers 14-a and 14-b are disposed at positions in which they are not influenced by the magnetic field. A head capsule 88 is constructed so as to cover the ears 20-R and 20-L, so that a space is formed inside the head capsule 88. The speakers 14-a and 14-b and the head capsule 88 are connected by non-magnetic vinyl tubes 40-a and 40-b. The microphones 12-a and 12-b are disposed at positions in which they are not influenced by the magnetic field and connected with the head capsule 88 by the non-magnetic vinyl tubes 40-a and 40-b. The embodiment is different from the seventh embodiment in that the driving signal is divided and delayed in the MRI apparatus, that the microphones are disposed in the position at which the microphones are not influenced by the magnetic field and connected with the head capsule by the tubes and that the characteristic of the tube connected with the microphones are corrected.

FIG. 19 shows a block diagram of a signal processing performed in the ANC. The filter coefficients D1L, D1R, D2L and D2R represent in pulse response vectors between the speakers and two noise cancellation positions near ears of the patient. The transmission correction filters 31R and 31L represent inverse characteristics of the in pulse response vectors between the microphones at the noise cancellation positions and the two positions near the ears of the patient. Thus, since a sound pressure can be presumed, the adaptive filter coefficients can be adapted so as to minimize the sound pressure at the noise cancellation positions. By such configuration above mentioned, a noise having randam nature can be decreased. And, since a sound is irradiated into the head capsule 88, dispersion of the sound decreases, so that the output power can be decreased. When the ears of the patient are covered by the head capsule 88, since the head capsule 88 can shut out the noise generated outside of the head capsule 88, the patient can be well soothed. A music can be outputted from the speaker in order to give a relaxation to the patient.

We claim:

1. In an MRI apparatus including a table for allowing a patient to lie down thereon inside a bobbin and a magnetism generator for applying a magnetic field to said patient, disposed at an outer peripheral portion of said bobbin, wherein the improvement comprises an active noise cancellation apparatus for said MRI apparatus including:
    (a) error signal detection means for detecting noise near ears of said patient lying down on said table;
    (b) noise source signal detection means for detecting a noise source signal produced from an operation of said magnetism generator;
    (c) means for generating a noise cancellation signal by processing said noise source signal detected by said noise source signal detection means so that an amplitude of a signal from said error signal detection means is minimized; and
    (d) sound generation means for generating sound in response to said noise: cancellation signal;
    wherein said sound generation means includes vibration means for vibrating said bobbin.

2. An active noise cancellation apparatus according to claim 1, wherein said vibration means includes piezoelectric devices fitted to said bobbin.

3. An active noise cancellation apparatus according to claim 1, wherein said noise source signal detection means includes means for detecting vibration of said bobbin.

4. An active noise cancellation apparatus according to claim 1, wherein said error signal detection means includes capacitance type microphones disposed near the ears of said patient on said table.

5. In an MRI apparatus including a table for allowing a patient to lie down thereon inside a bobbin and a magnetism generator for applying a magnetic field to said patient, disposed at an outer peripheral portion of said bobbin, wherein the improvement comprises an active noise cancellation apparatus for said MRI apparatus including:
    (a) error signal detection means for detecting signals used for calculating noise near ears of said patient lying down on said table;
    (b) noise source signal detection means for detecting a noise source signal produced from an operation of said magnetism generator;
    (c) means for generating a noise cancellation signal by processing said noise source signal detected by said noise source signal detection means so that an amplitude of a signal from said error signal detection means is minimized; and
    (d) sound generation means for generating sound in response to said noise cancellation signal;
    wherein said error signal detection means is disposed outside said bobbin, and said means for generating said noise cancellation signal includes means for generating said noise cancellation signal utilizing transmission characteristics of a sound wave transmission path of a space from positions near the ears of said patient to said error signal detection means.

6. An active noise cancellation apparatus according to claim 5, wherein said noise source signal detection means includes means for detecting vibration of said bobbin.

7. An active noise cancellation apparatus according to claim 5, wherein said error signal detection means includes capacitance type microphones disposed near the ears of said patient on said table.

8. In an MRI apparatus including a table for allowing a patient to lie down thereon inside a bobbin and a magnetism generator for applying a magnetic field to said patient, disposed at an outer peripheral portion of said bobbin, wherein the improvement comprises an active noise cancellation apparatus for said MRI apparatus including:
(a) error signal detection means for detecting noise near ears of said patient lying down on said table;
(b) noise source signal detection means for detecting a noise source signal produced from an operation of said magnetism generator;
(c) means for generating a noise cancellation signal by processing said noise source signal detected by said noise source signal detection means so that an amplitude of a signal from said error signal detection means is minimized; and
(d) sound generation means for generating sound in response to said noise cancellation signal;
wherein said error signal detection means includes:
first tubes made of a non-magnetic and non-metallic material, and extended outside said bobbin from near the ears of said patient on said table; and
detection means disposed at the tips of said first tubes outside said bobbin; and
wherein said means for generating said noise cancellation signal includes:
means for generating said noise cancellation signal utilizing transmission characteristics of a sound wave transmission path of said first tubes ranging from positions near the ears of said patient to said error signal detection means.

9. An active noise cancellation apparatus according to claim 8, wherein said sound generation means includes:
second tubes made of a non-magnetic and non-metallic material, and extended outside said bobbin from near the ears of said patient on said table; and
speakers disposed at the tips of said second tubes outside said bobbin.

10. An active noise cancellation apparatus according to claim 8, wherein said noise source signal detection means includes means for detecting vibration of said bobbin.

11. An active noise cancellation apparatus according to claim 8, wherein said error signal detection means includes capacitance type microphones disposed near the ears of said patient on said table.

12. In an MRI apparatus including a table for allowing a patient to lie down thereon inside a bobbin and a magnetism generator for applying a magnetic field to said patient, disposed at an outer peripheral portion of said bobbin, wherein the improvement comprises an active noise cancellation apparatus for said MRI apparatus including:
(a) error signal detection means for detecting noise near ears of said patient lying down on said table;
(b) noise source signal detection means for detecting a noise source signal produced from an operation of said magnetism generator;
(c) means for generating a noise cancellation signal by processing said noise source signal detected by said noise source signal detection means so that an amplitude of a signal from said error signal detection means is minimized; and
(d) sound generation means for generating sound in response to said noise cancellation signal;
wherein said noise source signal detection means includes means for detecting a driving signal of said magnetism generator and further including means for delaying said driving signal inputted to said magnetism generator such that a noise due to driving of said magnetism generator by said inputted driving signal occurs later than said noise cancellation sound wave.

13. An active noise cancellation apparatus according to claim 12, wherein said means for generating said noise cancellation signal includes:
frequency characteristics changing means using said driving signal as an input; and
means for generating a reference signal for generating said noise cancellation signal from an output of said frequency characteristics changing means.

14. An active noise cancellation apparatus according to claim 13, wherein transmission characteristics of said frequency characteristics changing means are set to transmission characteristics of said driving signal and noise generated by said driving signal.

15. An active noise cancellation apparatus according to claim 14, wherein said frequency characteristics changing means includes a circuit comprising a digital filter.

16. An active noise cancellation apparatus according to claim 15, wherein said frequency characteristics changing means comprises a non-linearity operation circuit.

17. An active noise cancellation apparatus according to claim 12, wherein said sound generation means includes:
first tubes made of a non-magnetic and non-metallic material, and extended outside said bobbin from near the ears of said patient on said table; and
speakers disposed at tips of said first tubes outside said bobbin.

18. An active noise cancellation apparatus according to claim 17, wherein said error signal detection means includes:
second tubes made of a non-magnetic and non-metallic material, and extended outside said bobbin from near the ears of said patient on said table; and
error signal detection means disposed at tips of said second tubes outside said bobbin.

19. An active noise cancellation apparatus according to claim 12, wherein said delaying means comprises means for setting a delay time of said driving signal longer than a summed period of a delay time and a transmission time from said sound generation means to said error signal detection means.

20. An active noise cancellation apparatus according to claim 12, wherein said sound generation means comprises a speaker and first tube means coupled to said speaker for transmitting the sound, and
said active noise cancellation apparatus further comprising a pair of sound reception means of headphone type comprising a microphone and second tube means coupled to said microphone for transmitting the sound.

21. An active noise cancellation apparatus according to claim 12, wherein said sound generation means comprises a speaker and first tube means coupled to said speaker for transmitting the sound, and said active noise cancellation apparatus further comprising sound reception means which covers ears of the patient and forms a space around said ears, said sound reception means comprising a microphone and second tube means coupled to said microphone for transmitting the sound.

22. An active noise cancellation apparatus according to claim 12, wherein said sound generation means comprises means for adding an information signal to to said noise cancellation signal for transmission to said patient.

23. An active noise cancellation apparatus according to claim 22, wherein said adding means further comprises means for providing a music signal and for adding said music signal to said noise cancellation signal.

24. An active noise cancellation apparatus according to claim 22, wherein said adding means comprises means for controlling a sound volume and quality of said information signal.

25. In an MRI apparatus including a table for allowing a patient to lie down thereon inside a bobbin and a magnetism generator for applying a magnetic field to said patient, disposed at an outer peripheral portion of said bobbin, wherein the improvement comprises an active noise cancellation apparatus for said MRI apparatus including:
  (a) error signal detection means for detecting a vibration of said bobbin to calculate noise near ears of said patient lying down on said table;
  (b) noise source signal detection means for detecting a driving signal of said MRI apparatus;
  (c) means for generating a noise cancellation signal having a phase opposite to a phase of said noise source signal from said noise source signal detection means, and having an amplitude proportional to a magnitude of a signal from said error signal detection means; and
  (d) sound generation means for vibrating said bobbin in response to said noise cancellation signal.

* * * * *